US006188052B1

(12) United States Patent
Trucco

(10) Patent No.: US 6,188,052 B1
(45) Date of Patent: Feb. 13, 2001

(54) MATRIX-INDUCTOR SOLDERING APPARATUS AND DEVICE

(76) Inventor: Horacio Andrés Trucco, 25 Nursery Rd., Melville, NY (US) 11747-1048

( * ) Notice: Under 35 U.S.C. 154(b), the term of this patent shall be extended for 0 days.

(21) Appl. No.: 09/396,923

(22) Filed: Sep. 14, 1999

Related U.S. Application Data

(60) Provisional application No. 60/103,848, filed on Oct. 10, 1998.

(51) Int. Cl.[7] ............................... H05B 6/10; H05B 6/40
(52) U.S. Cl. ...................... 219/603; 219/605; 219/616; 219/638; 219/672; 219/661; 228/180.1; 29/878
(58) Field of Search ..................... 219/605, 616, 219/650, 662, 672, 675, 636, 638, 615, 661, 663, 603; 228/180.1; 438/128; 29/860, 878

(56) References Cited

U.S. PATENT DOCUMENTS

| 4,327,265 | * | 4/1982 | Edinger et al. | 219/616 |
| 4,795,870 | * | 1/1989 | Krumme et al. | 219/616 |
| 4,983,804 | * | 1/1991 | Chan et al. | 219/605 |
| 5,523,617 | * | 6/1996 | Asnasavest | 257/666 |

FOREIGN PATENT DOCUMENTS 1-84589 * 3/1989 (JP) ...................... 219/675
1485002 * 6/1989 (SU) ...................... 219/675

* cited by examiner

Primary Examiner—Philip H. Leung

(57) ABSTRACT

A new apparatus and process for soldering surface-mount and through-hole type electronic components into a printed circuit board (PCB) in an automated fashion utilizing localized electromagnetic induction heating. Current manufacture technology for packaging electronic components depends exclusively on the reflow and wave soldering processes. Both processes heat up to relatively high temperature the entire assembly, namely its PCB and all the electronic components been soldered into it. Such high temperature environment frequently causes components damage resulting in rejects and/or demanding rework. With this invention however, during a soldering operation only the leads and pads, or joints, being soldered are heated but neither the body, or casing, of said electronic components nor the dielectric material forming said PCB are heated. Because of this selectively localized heating, the invention permits to reduce cost and improve the quality and reliability of manufactured products. This invention consumes about 200 times less energy than the reflow and wave soldering processes. Also allows in-process, and in-situ, testing of soldered joints quality thus permitting rework before final assembly of a PCB is completed. This invention also provides for an useful de-soldering apparatus.

14 Claims, 11 Drawing Sheets

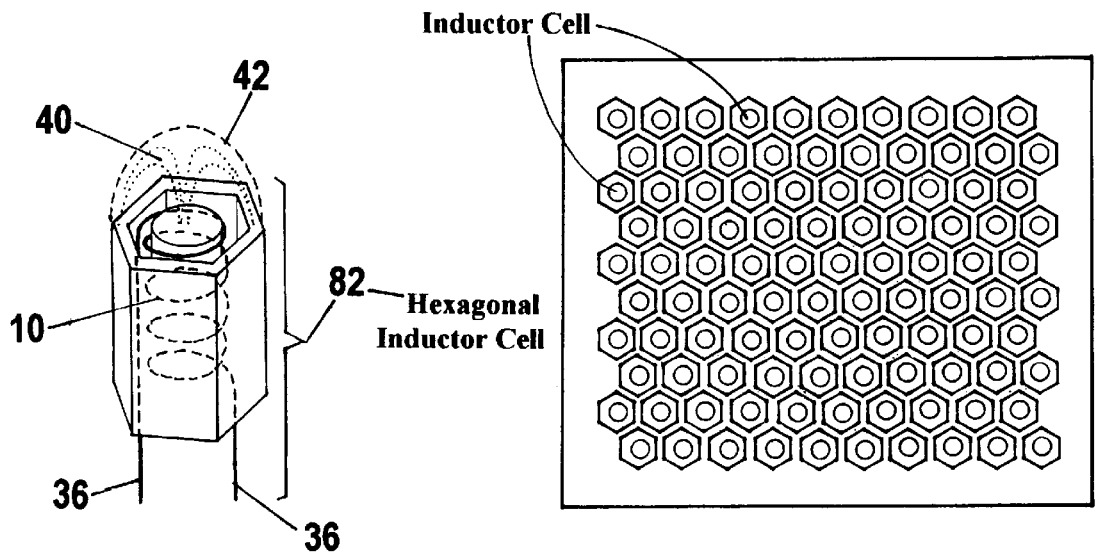
Fig. 19
Fig. 20
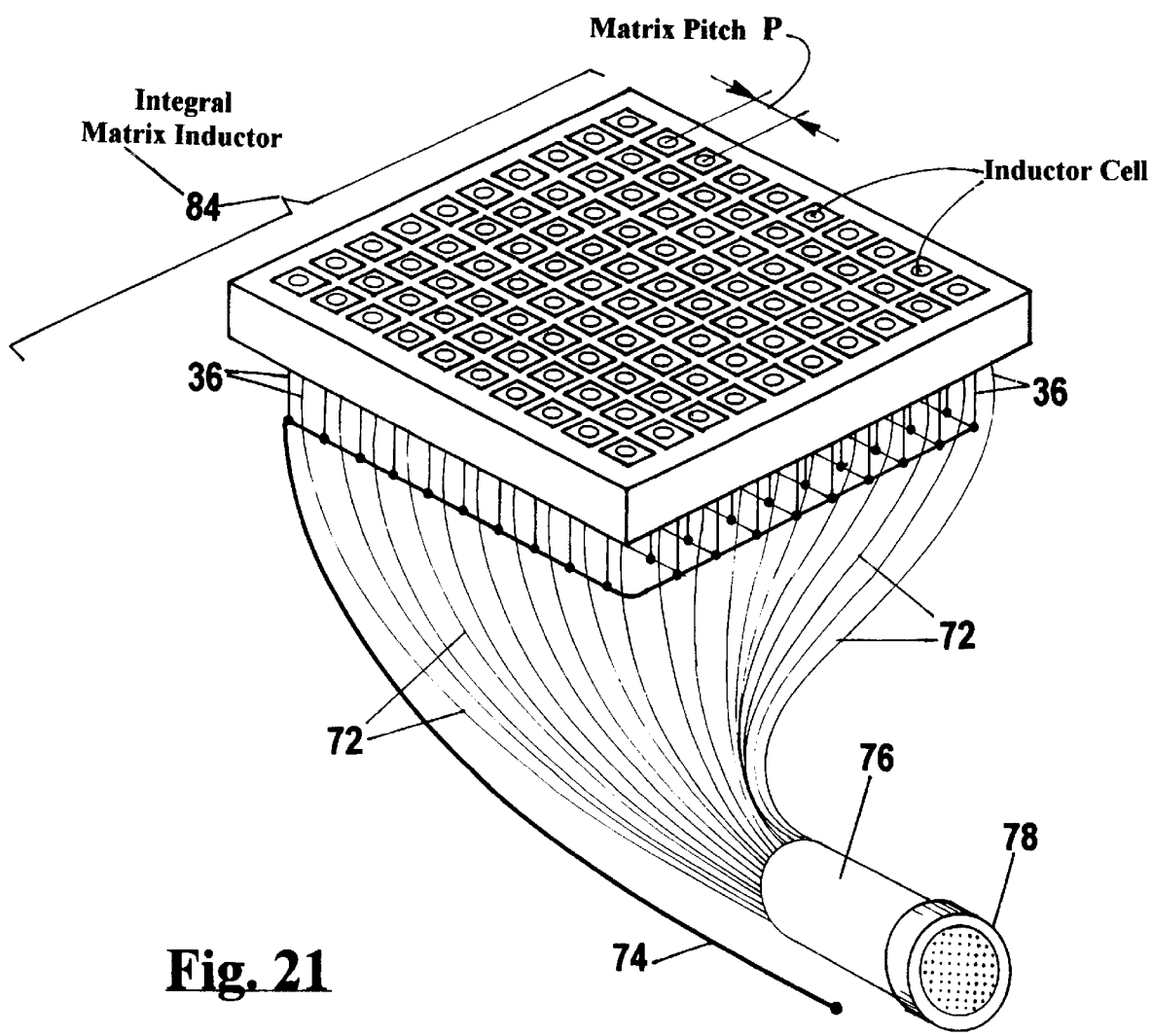
**Fig. 21

MATRIX-INDUCTOR SOLDERING APPARATUS AND DEVICE

This application claims the benefit of U.S. Provisional Patent Application Ser. No. 60/103,848, filed Oct. 10, 1998.

FIELD OF INVENTION

This invention relates to a novel soldering apparatus and soldering process for joining electronic components to a printed circuit board utilizing localized electromagnetic induction heating.

BACKGROUND-DESCRIPTION OF THE PRIOR ART

The manufacture of most modern electronic products require a printed circuit board (PCB) that allows to electrically interconnect a variety of electronic components and also holds them together in a relatively rigid condition. Many types of components are placed over a single PCB. Electronic components such as resistors, capacitors, inductors, transformers, integrated circuit (IC) packages, connectors, headers, RF shields, LEDs, switches, board interface systems, battery sockets, etc. are electrically connected and restrained by means of soldered joints. These joints can be obtained by three methods: hand soldering, the wave soldering process and by the reflow soldering process.

Mass production exclusively utilizes wave and reflow soldering processes, either individually or in combination. Both processes exhibit inherit disadvantages that indeed, increase the cost of the final product, generate rejects, require rework and reduce the reliability of the final product. The electronic manufacturing industry accepts these inherit drawbacks and shortcomings, and works around them, for lack of a more suitable soldering process.

Both wave and reflow soldering processes simultaneously heat up the entire electronic product, meaning the PCB and all of the components been soldered to the PCB, to a temperature ranging from about 20° C. (degree Celsius) to 40° C. above the temperature at which the utilized solder alloy melts or reaches liquidus state. The melting temperature of solder alloys utilized by the electronic industry ranges from 190° C. to 300° C.

The majority of consumer electronic products need to be rated, and indeed are, to operate at maximum temperatures that range from 50° C. to 90° C. Consequently, components that form part of every electronic product manufactured by either wave or reflow soldering processes are required to survive temperatures from 120° C. to 190° C. higher than those temperatures encountered during their most severe actual operation. Therefore, all electronic components must be unnecessarily temperature-overrated to tolerate or survive the soldering process. This requirement for high-temperature-exposure survival increases the cost of every component to be soldered to a PCB.

During the soldering process, thermal shock (due to a fast heating rate) can crack certain components, in particular ceramic capacitors, increasing rejects and/or requiring costly rework. Fast heating of plastic IC packages could induce cracking when moisture absorbed inside said packages can turn into steam during a reflow soldering process causing the so called "pop-corn" effect that internally damage the IC package. Electrolytic capacitors are extremely sensitive to high temperature exposure. Laminated PCBs may become soft by extended exposure to heat. An increase in soldering process temperature can damage a PCB metal-plated through-holes or vias, by cracking their barrels due to differential thermal expansion between the PCB dielectric material and its barrels' plating metal. Warpage, or twisting of a PCB, increases with soldering temperature. Warpage can cause defective soldered joints because coplanarity of the mating surfaces is compromised. In addition, defective joints result due to movement of the components from there intended soldering pads location. During the soldering operation, components can move due to liquefied-solder surface tension effects and other factors.

In conclusion, the cost of manufacturing electronic products around PCBs can be reduced and the quality and reliability of said products improved, if a new soldering process could be created to replace both the wave and the reflow processes. A new soldering process to be effective, should only heat the soldering pads (or lands) on a PCB and the mating leads (or terminations) extending out from electronic component casings, while allowing said casings to remain relatively cold. Such a novel soldering process should permit the elimination of all the disadvantages enumerated above.

When this inventor realized the urgent and long-felt need to create a device to efficiently solder electronic components to a PCB without heating the whole assembly, the objectives and purposes of this invention were inspired, leading him to the conception and the accomplishment of this invention.

OBJECTIVES AND ADVANTAGES OF THE INVENTION

The general objective of my invention is to provide the electronic manufacturing or electronic packaging industry with a new, safe, reliable, speedier and useful device for soldering components to a PCB. Because my invention only heats the leads and pads to be joined by solder while the rest of a component (namely its casing or housing) remains relatively cold, utilization of my invention will help to reduce manufactured-product cost. Components rated to tolerate much lower temperature exposure (than now required when utilizing reflow or wave solder processes) will be acceptable. Also my invention allows to improve the quality and reliability of the manufactured product. My invention help reduce formation of intermetallic layers inside soldered joints thus improving their robustness. My invention also allows to control the rate of solder solidification resulting in more robust soldered joints. Furthermore, my invention permit in-process and in-situ testing of soldered joints quality, thus allowing rework before final assembly is completed. My invention can solder a typical PCB up to fifty times faster than wave or reflow processes. In addition it provides for a useful de-soldering device. My invention also allows to reduce the required manufacturing floor space.

Further objectives and advantages of my invention will become apparent from a consideration of the drawings and following descriptions.

BRIEF DESCRIPTION OF THE DRAWING FIGURES

FIG. 19 shows, in perspective view, an hexagonal inductor cell.

FIG. 20 shows, in top view, an integral matrix inductor that incorporates hexagonal inductor cells.

FIG. 21 shows, in perspective view, an integral matrix inductor that incorporates square inductor cells.

REFERENCE NUMERALS IN DRAWINGS

Note that when significantly similar parts (performing a similar function and achieving a similar result) are used by more than one assembly, the same numeral is assigned to that part in different figures. In the following listing those similar parts are denoted by a "(*)" after their names.

Figure 22:
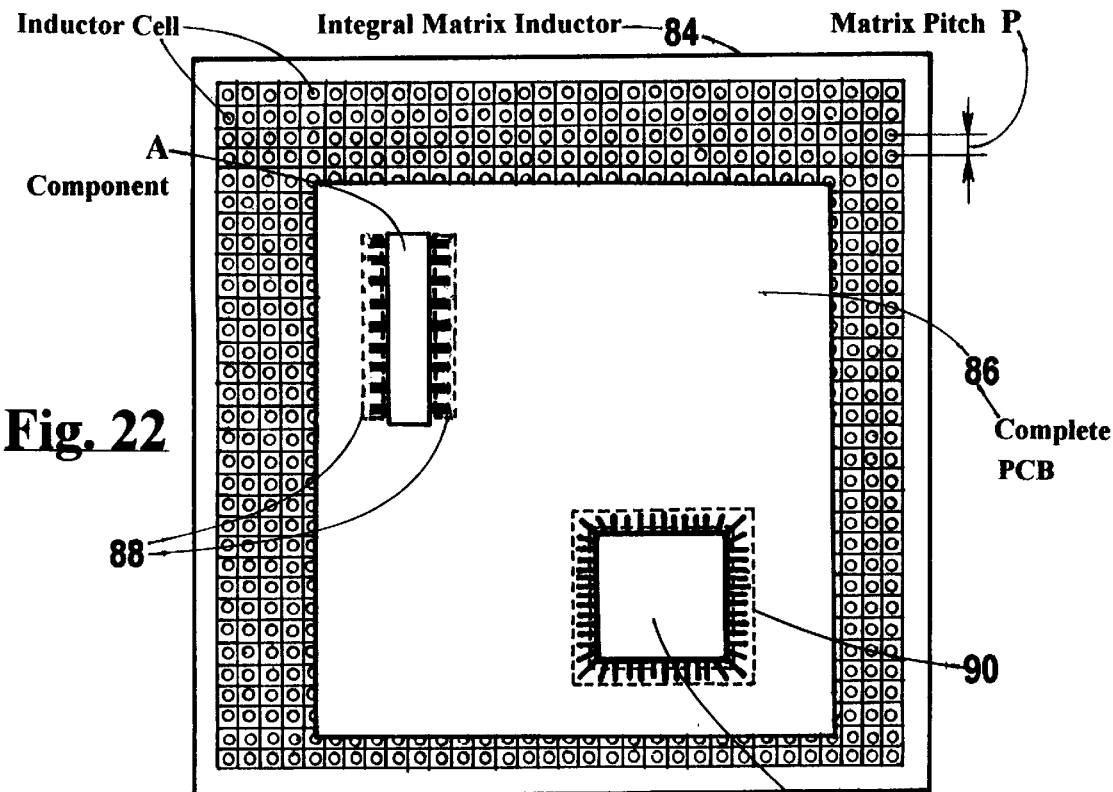
FIG. 22 shows, in top view, a complete PCB with two components labeled A and B placed on its top ready to be soldered. The PCB is placed over an integral matrix inductor.
Figure 23:
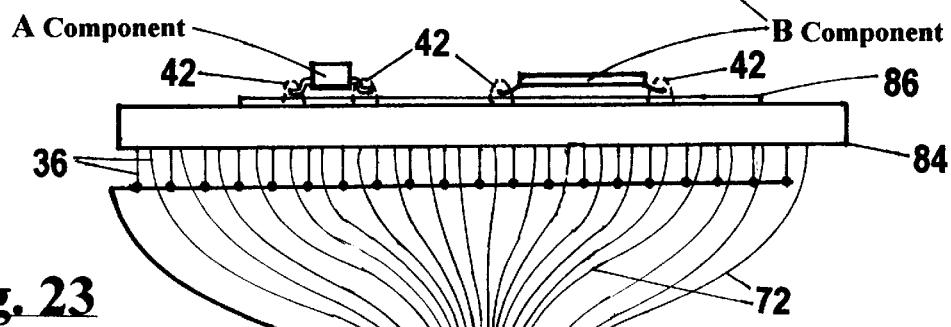
FIG. 23 shows, in side view, the parts shown in FIG. 22.

10 solenoid (*)
12 metal bar (*)
14 variable magnetic field (*)
16 shaded region
18 volume heated
20 left end of bar 12
22 right end of bar 12
24 variable magnetic field boundary (*)
26 heated zone
28 cylindrical shell, part of 34
30 central rod, part of 34
32 base closure, part of 34
34 magnetic core, part of 44
36 terminals of solenoid 10, part of 44, and other. (*)
38 axis-symmetric air gap
40 variable magnetic field (*)
42 boundary of variable magnetic field 40 (*)
44 cylindrical inductor cell (*)
46 portion of a PCB (*)
48 surface-mount component (*)
50 lead (or termination) of component 48 (*)
52 solder pad, part of 46 (*)
54 solder paste (*)
56 through-hole mount component
58 annular solder ring, part of 46
60 insertion lead, part of 56
62 PCB hole
64 solder paste
66 holding frame, part of 80 and 92 (*)
68 top face, part of 80
70 base face or underside, part of 80
72 extension wire, part of 80, 84, 92 and 96 (*)
74 common extension wire, part of 80, 84, 92 and 96 (*)
76 optional cable harness, part of 80, 84, 92 and 96 (*)
78 optional interface connector, part of 80, 84, 92 and 96 (*)
80 flat matrix inductor
82 hexagonal inductor cell
84 integral matrix inductor
86 complete PCB (*)
88 area encompassing soldered joints footprints corresponding to component A in FIGS. 22 and 23
90 area encompassing soldered joints footprint corresponding to component B in FIGS. 22 and 23
92 embossed matrix inductor 94 cavity or niche
96 incomplete matrix inductor
98 inductor cell (equivalent to 44, 82, etc.)
100 rigid filler material
102 recess or ceiling
110 flat matrix inductor (equivalent to 80 and 84)
112 switching device
114 programmable controller
116 radio-frequency generator
118 individual cell (equivalent to 44, 82, 98, etc.)
120 single pole switch
122 single-sided PCB
124 embossed matrix inductor (equivalent to 92)
126 double-sided PCB
128 incomplete matrix inductor (equivalent to 96)
130 generic PCB (single- or double-sided)
132 commercially available pick-and-place machine
134 feedback controller
136 solid state switch

SUMMARY OF THE INVENTION

This invention discloses a novel soldering apparatus and soldering process for joining electronic components to a PCB utilizing localized electromagnetic induction heating. Specifically my invention improves the soldering of said components with a new and safe approach. During soldering operation my apparatus/process only heats the pads-and-leads to be joined by solder, while the main body of the electronic components being soldered and the PCB dielectric material remain relatively cold. As a result, soldered products become of better quality and more reliable and its manufacture cost is reduced.

DESCRIPTION OF ELECTROMAGNETIC INDUCTION HEATING

Before referring specifically to the novel components comprising embodiments of my invention, it is desirable to present an overview of the physics principle governing Electromagnetic Induction Heating (E.I.H.). The following description, though simplified and concise, will benefit those readers unfamiliar with the principle and practice of E.I.H. For an in-depth treatment of theory, practice and application of E.I.H. the reader is referred to either: engineering handbooks, textbooks, electric heating trade magazines and journals, industrial heating conference proceedings and data sheets from manufacturers of E.I.H. equipment.

Figure 1:
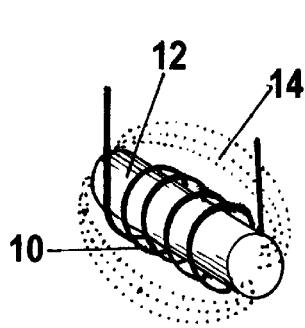
FIG. 1 shows, in perspective view, a solenoid wound around a round metal bar.

Referring to FIG. 1, if a solenoid 10 wound around a metal bar 12 is supplied with an alternating current, a variable magnetic field 14 is generated (inside and around solenoid 10) which in turn induces eddy currents inside bar 12. The eddy currents are converted into heat by the Joule effect. It is fundamental to recognize that E.I.H. allows to heat metallic bodies (or electric conductors), but not electric insulators, to very high temperatures by a solenoid, or winding, that essentially remains cold. Conventional heating uses a heat source having a higher temperature than that of the body to be heated. Heat from the hot source is transferred to all bodies surrounding the source (indistinctively if a body is an electric conductor or an electric insulator). Heat can be transferred by conduction, convection, radiation or a combination of the three mechanisms.

Figure 2:
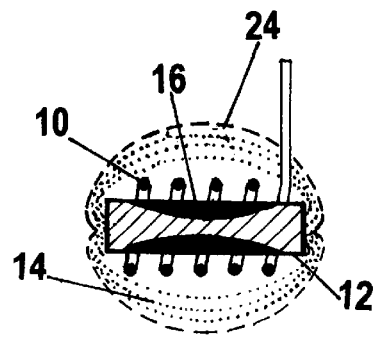
FIG. 2 shows, in cross section, the solenoid and metal bar shown in FIG. 1.
Figure 3:
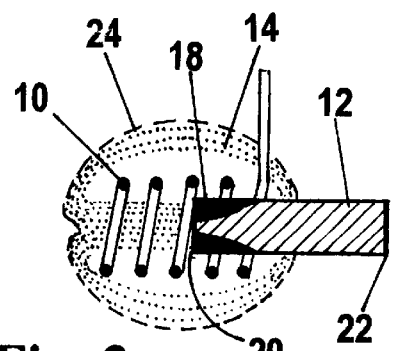
FIG. 3 shows, in cross section, the metal bar of FIG. 2 displaced toward one side of the solenoid.
Figure 4:
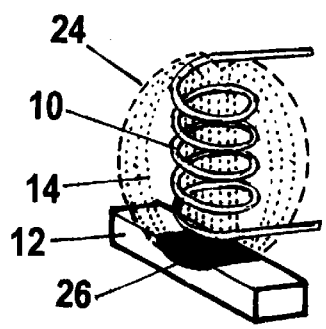
FIG. 4 shows, in perspective view, a rectangular metal bar placed adjacent to a solenoid.

FIGS. 2 through 4 will assist the reader to understand the basic properties that characterize the E.I.H. process. FIG. 2 shows, in cross-section, same solenoid 10 and bar 12 of FIG. 1, and in addition depicts a shaded region 16 representing where most of the heat induced by the variable magnetic field 14 is localized. In other words, the figure teaches that induced electric currents flowing through bar 12 concentrate near the surface. Consequently, temperatures induced inside bar 12 decrease from the surface toward the center. This phenomenon is known as skin effect. If bar 12 is displaced toward one side of solenoid 10, as shown in FIG. 3, the mass or volume heated 18 by a variable magnetic field 14 will be smaller and will be localized at the end 20 of bar 12. The rest of the bar, including its opposite end 22, will remain unheated because most of bar 12 lays outside the variable magnetic field boundary 24. If bar 12 is placed outside boundary 24 it will remain unheated. Consequently any region of a component subjected to E.I.H. can be protected from being heated by placing the desired region outside the—effective—envelope (or boundary) of the corresponding variable magnetic field. As will be shown below, the variable magnetic field boundary 24 can be shaped by proper design to exclude adjacent regions not to be heated. In free space, a variable magnetic field 14 extends to infinitive while its intensity (number of lines per unit area) rapidly decreases, away from solenoid 10, approaching zero level. It is convenient to define a boundary 24 as a surface limiting the spatial extent of field 14 to an arbitrary non-zero intensity, say, no lower than 5% of its maximum level. Beyond boundary 24 field 14, for all practical purposes, should be considered ineffective. The same conceptual definition will be adopted below when introducing boundary 42.

For sake of clarity, the cases of E.I.H. depicted by FIGS. 1 through 3 were intentionally selected to be axis-symmetrical in configuration. However, E.I.H. is applicable to any non-symmetrical configuration. Neither the variable magnetic field nor the part to be heated need to be symmetrical. Furthermore, the part to be heated does not need to be placed inside a solenoid to achieve heating. FIG. 4 shows, in perspective view, a particular case of non-symmetrical E.I.H. The resulting heating on a rectangular bar 12 is localized over a non-symmetric heated zone 26. In the above explanation it was assumed that the E.I.H. process was applied for a short duration (a transient application of energy) thus allowing to assume that heat transferred, or its migration, by conduction inside bar 12 was insignificant.

In order to simplify FIGS. 1 through 4 doted-line paths representing field 14 are omitted where traversing (or extending) inside bar 12. The same approach was adopted to represent variable magnetic fields in subsequent figures.

The power converted into heat by E.I.H. depends on: (1) the electrical resistivity of the material being heated, (2) the magnetic permeability of the material being heated and (3) the frequency of the current flowing through the solenoid. When a part to be heated is made from a magnetic material such as iron (also various types of steel, cobalt, etc.) the heat dissipated by the magnetic hysterisis characterizing such materials, is added to the above described magnetically induced heat. However, in most cases, the heat dissipated by hysterisis is less than 10% of the heat generated by induced currents.

To complement the above description of the E.I.H. process it is important to explicate how the three parameters cited above affect the penetration of induced currents. At the surface of the part being heated, the maximum induced current density concentrates and its level decreases from the surface toward the center in a exponential fashion. The higher the frequency of the current flowing through solenoid 10, the greater the tendency of the induced current to concentrate nearer to the surface of the part being heated. More specifically, the current penetration depth, also known as skin thickness, is directly proportional to the square root of the electric resistivity of the part being heated and inversely proportional to the square root of both the magnetic permeability of the part being heated and the frequency of the current flowing through solenoid 10. Consequently, if a part needs to be heated uniformly throughout its thickness, relatively low frequency should be chosen. Conversely, if the heat should be concentrated on the surface of the part then relatively high frequency must be utilized.

For our primary application, assembly of electronic components on PCBs, it is sufficient, and some times preferable, to heat the surface of the joints to be soldered but not to heat uniformly through their thickness. Typical thickness of a copper connector or PCB pad to be soldered could be about one tenth of a millimeter (0.1 mm). If we wish to restrict the induced heat to within one hundredth of a millimeter (0.01 mm) from the surface, it will require a current frequency of about 100 MHz. If the copper is replaced by steel material, the needed current frequency to obtain the same heating result should be of the order of 10 MHz. The frequency selection also depends on the geometry of the part to be heated and the heating rate desired.

Summarizing, E.I.H. exhibits three important properties that are advantageously exploited by my invention, namely: (1) direct creation of localized heat inside the part to be heated without utilizing a hot source, (2) very low thermal inertia and (3) very high heat (or power density) concentration on the surface of the part being heated. The E.I.H. process can induce or deliver heat rate per unit surface area, up to 100 times higher than those transferred by a reflow soldering process. Now that the fundamentals of E.I.H. have been described, I shall proceed with the description of a specialized solenoid-configuration that will, later on, help to understand how and why my invention works.

Figure 5:
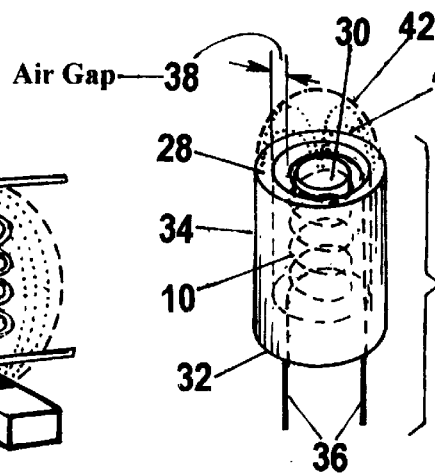
FIG. 5 shows, in perspective view, a solenoid wound around and inside a ferromagnetic core forming a cylindrical inductor cell.
Figure 6:
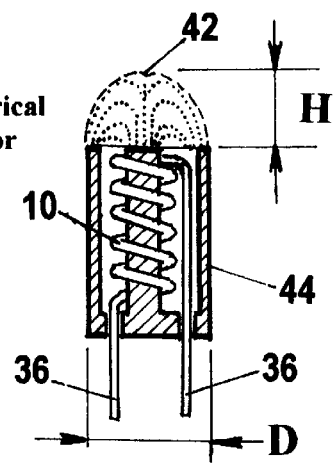
FIG. 6 shows, in cross section, the assembly shown in FIG. 5.
Figure 7:
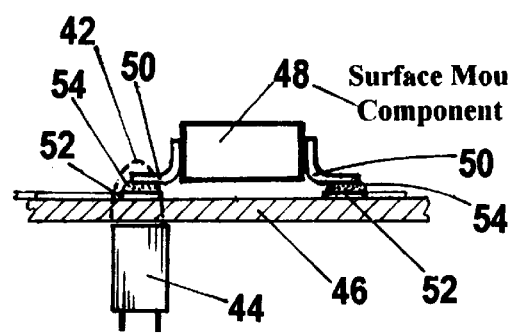
FIG. 7 shows, in side view, the effect of magnetomotive force intensity on induced-magnetic-field height H.

FIG. 5 shows, in perspective view, solenoid 10 wound inside a cylindrical shell 28 and around a central rod 30. Shell 28 and rod 30 are joined through a base closure 32 forming an integral magnetic core 34. Solenoid 10 has its two terminals 36-36 extended outside core 34 by feeding through closure 32 wall. Core 34 presents a magnetic path discontinuity on its top, shaped as an axis-symmetric air gap 38. The complete core 34 is made of high permeability material that exhibits low hysterisis losses such as ferrite or equivalent. When terminals 36-36 are supplied with an alternating current, this specific configuration produces an axis-symmetric variable magnetic field 40 confined within a dome-shaped boundary 42. Magnetic field 40 is concentrated and thus more intense than the previously described magnetic field 14 which is produced by an open-air solenoid, as shown in FIGS. 1 through 4. The inclusion of core 34 around-and-inside solenoid 10 results in self-shielding of most of the variable magnetic field, allowing the field to only emanate through air gap 38. The assembly comprising solenoid 10, core 34 and terminals 36-36 will be referred to as a cylindrical inductor cell 44. To further clarify some important properties of cored inductors, FIG. 6 shows in cross-sectional view, the same inductor cell 44 shown in FIG. 5. It is important to recognize that the height H of boundary 42 is proportional (among other parameters) to the outside diameter D of inductor cell 44 and to the magnetomotive force (given in ampere-turns) produced by solenoid 10 when supplied with an alternating current. This dependence of height H on magnetomotive force exerted by coil 10 is qualitatively illustrated in FIG. 7. The maximum height H that a boundary 42 can reach is limited by the saturation flux density characterizing the material forming magnetic core 34.

Figures 8, 9:
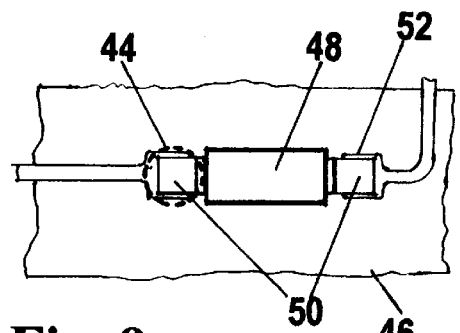
FIG. 8 shows, in side view, an inductor cell placed under a PCB in proper position to solder one joint of a surface-mount component into said PCB.
FIG. 9 shows, in top view, the same components shown in FIG. 8.
Figure 10:
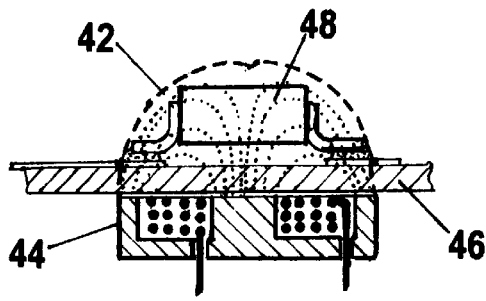
FIG. 10 shows, in cross-sectional side view, a relatively large inductor cell placed under a PCB in proper position to solder both joints of a surface-mount component into said PCB.
Figure 11:
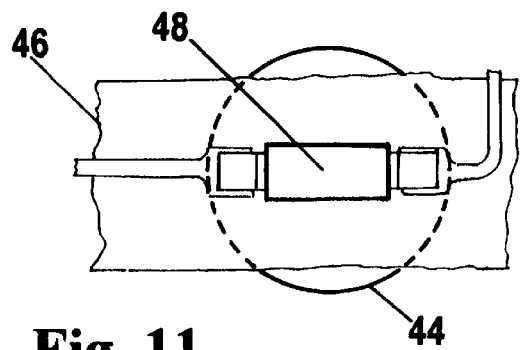
FIG. 11 shows, in top view, the same components shown in FIG. 10.

Now let's examine the application of E.I.H. to the soldering of a surface-mount component to a matching PCB utilizing a single inductor cell 44. A possible setup to accomplish a typical solder operation is shown in FIGS. 8 and 9. In particular, FIG. 8 shows in side view, portion of a PCB 46, and placed on its top a surface-mount component 48 ready to be soldered at one of its two connecting leads 50-50 to one of two PCB's pads 52-52. Adequate amount of solder paste 54-54 is pre-placed between leads 50-50 and pads 52-52. If an alternating current (preferably within the radio-frequency spectrum) is supplied to inductor cell 44, the induced variable magnetic field 40 passes across PCB 46 thickness emerging above its top surface. Because lead 50 and pad 52 are submerged inside boundary 42 they will be heated. Simultaneously, heat will be transferred from, both, lead 50 and pad 52 to paste 54 until its solder alloy melts. The alternating current is terminated once the solder alloy contained into paste 54 reaches an adequate temperature level above its melting point to wet both, lead 50 and pad 52. Subsequently, lead 50, pad 52, and liquefied solder cool down, causing the solder alloy to solidify creating a soldered joint. The soldering process is completed. It is very important to realize that the dielectric material forming PCB 46 structure (or thickness) is not heated by field 40 because it is an electrical insulator. Only electric conductors are heated by the variable magnetic field. FIG. 9 shows, in top view, the components depicted in FIG. 8. Notice that only lead 50 on the left side of component 48 can be soldered because it is the only one submerged into boundary 42. This prior-art manner of using E.I.H. for soldering electronic components to a PCB is inadequate, inefficient and extremely costly for mass production application. It can only be applicable to a hand-solder device. To simultaneously solder the two leads 50-50, a larger-size single inductor can be utilized. This prior-art approach is shown in FIG. 10 and FIG. 11, displaying component 48 completely submerged inside a larger boundary 42. However, during soldering operation the whole body of component 48 could be heated contrarily to the objectives of my invention.

Many electronic components soldered to PCBs contain inside their casing electrically conductive materials that will be heated if submerged inside a field 40. Furthermore, internally located electrically conductive parts will heat up much faster than its external leads because, in general, they have a much smaller—thermal mass—than that of its external leads. Said internal parts could reach much higher temperatures than those of the leads been soldered. As a result such components could be damaged by overheating thus defeating and invalidating the objectives of this invention.

When soldering electronic components to a PCB utilizing E.I.H. according to the prior-art as illustrated in FIGS. 10 and 11, one encounters the fundamental disadvantage pointed out in the preceding paragraphs.

E.I.H. prior-art customized to solder a specific component into a PCB is found in the three following patents; (1) U.S. Pat. No. 4,789,767 Autoregulating multi contact induction heater issued Dec. 6, 1988 that teaches how to solder a multi-pin connector to a PCB, (2) U.S. Pat. No. 4,795,870 Conductive member having integrated self-regulating heaters issued Jan. 3, 1989 that teaches how to solder a bus bar to a PCB and (3) U.S. Pat. No. 4,983,804 Localized soldering by inductive heating issued Jan. 8, 1991 that teaches how to solder a flexible circuit to a PCB. Non of the above cited patents pursue neither the objectives nor the approach of my invention. Their scope and claims are totally different from those of my invention.

Figure 12:
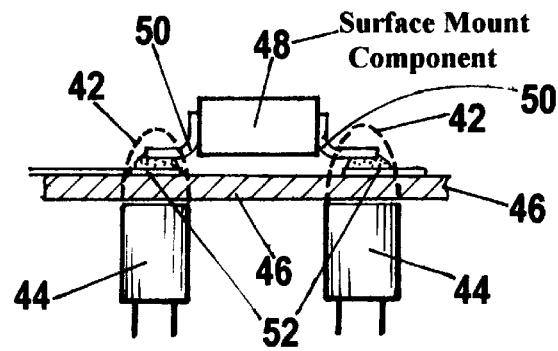
FIG. 12 shows, in side view, a pair of inductor cells placed under a PCB in proper position to simultaneously solder both joints of a surface-mount component into said PCB.
Figure 13:
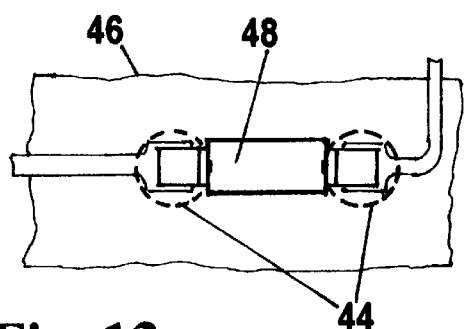
FIG. 13 shows, in top view, the same components shown in FIG. 12.
Figure 14:
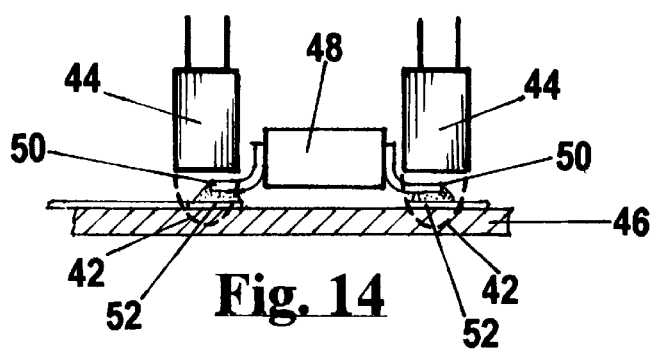
FIG. 14 shows, in side view, a pair of inductor cells placed above a PCB in proper position to simultaneously solder both joints of a surface-mount component into said PCB.

The following concepts will further assist the reader to understand the operational principle of my invention and will help to discover the improvements that are achievable when soldering electronic components to PCBs utilizing my invention. FIGS. 12 and 13, both show the same PCB 46 and component 48 depicted in FIGS. 8 through 11. Now however, a pair of inductor cells 44-44 is placed under PCB 46 such as that their individual boundaries 42-42 each engulfs a set of mating lead 50 and pad 52. Notice that the main central portion or body of component 48 remains outside boundaries 42-42. If an alternating current is simultaneously supplied to both inductor cells 44-44, then both leads 50-50 will be soldered to pads 52-52 at the same time. Notice that the main body of component 48 is not being heated because it lays outside both boundaries 42-42. Consequently, the fundamental disadvantage of soldering by prior-art E.I.H. is circumvented by utilizing, at least, a pair-of-inductors of proper size correctly located so as to only heat the surfaces to be joined. An alternate manner of utilizing a pair-of-inductors to solder a component on a PCB is illustrated in FIG. 14, where a pair of inductor cells 44-44 is placed above PCB 46 such that their individual boundaries 42-42 each directly engulfs a set of mating lead 50 and pad 52 without traversing through said PCB 46 thickness.

Figure 15:
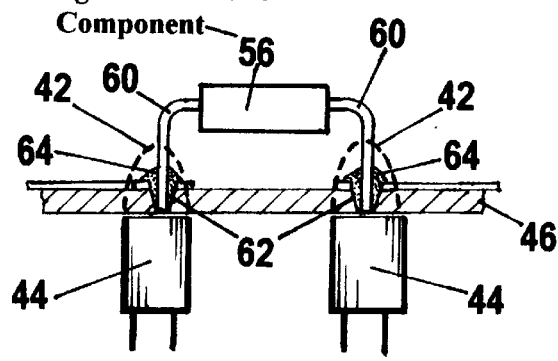
FIG. 15 shows, in side view, a through-hole mount component inserted into a PCB ready to be soldered by a pair of inductor cells placed under said PCB.
Figure 16:
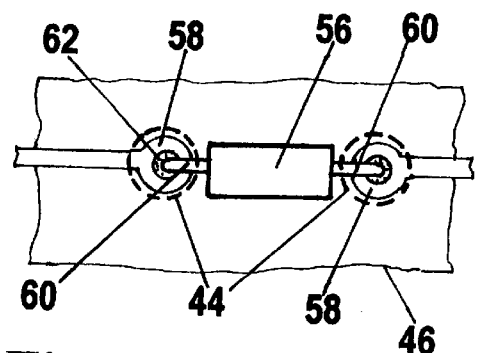
FIG. 16 shows, in top view, the same component shown in FIG. 15.

Until now I limited the above description of the application of my invention to surface-mount components only, as depicted in FIGS. 8 through 14. Nevertheless, my invention is equally applicable for soldering through-hole mount components. To illustrate this claim, FIGS. 15 and 16 depict, in side view and top view respectively, a through-hole mount component 56 ready to be soldered to annular solder rings 58-58 that are part of PCB 46. Component 56 has a pair of insertion leads 60-60 shown inserted into PCB holes 62-62. Solder paste 64-64 is deposited between ring 58 and lead 60. One cell 44 is placed under each hole 62, such that during the soldering operation its corresponding boundary 42 engulfs the tip of lead 60, ring 58 and paste 64. The procedure is also applicable to plated through-holes, or vias. Possible damage of inductor cell 44 due to dripping of molten solder can be avoided by utilizing two or more inductor cells located off-center from the hole 62 axis. We can conclude that my invention discloses a universal apparatus equally applicable to solder any type of component into PCBs.

One of the objectives of my invention is to provide means to solder a plurality of electronic components to a PCB with a single soldering tool. Noticing that those electronic components are characterized by incorporating leads (or terminations) different in type and size, with different number of leads per component, and with different spacing among themselves, it is evident that the—one-pair-inductor approach—described above in FIGS. 12 through 16 does not permit to efficiently solder such a diversity of components. The preceding approach, though novel, is inadequate, inefficient and extremely costly for mass production application.

Description of the Invention

Now, aided by FIGS. 17 through 31, I shall illustrate and describe the novel and non-obvious components that form part of the embodiments of my invention. Because the actual embodiments of my invention also include items-of-commerce recognized as public-domain prior-art, the preferred embodiments will be illustrated afterwards in FIGS. 32 through 37 and described in the next part of this specification.

Figure 17:
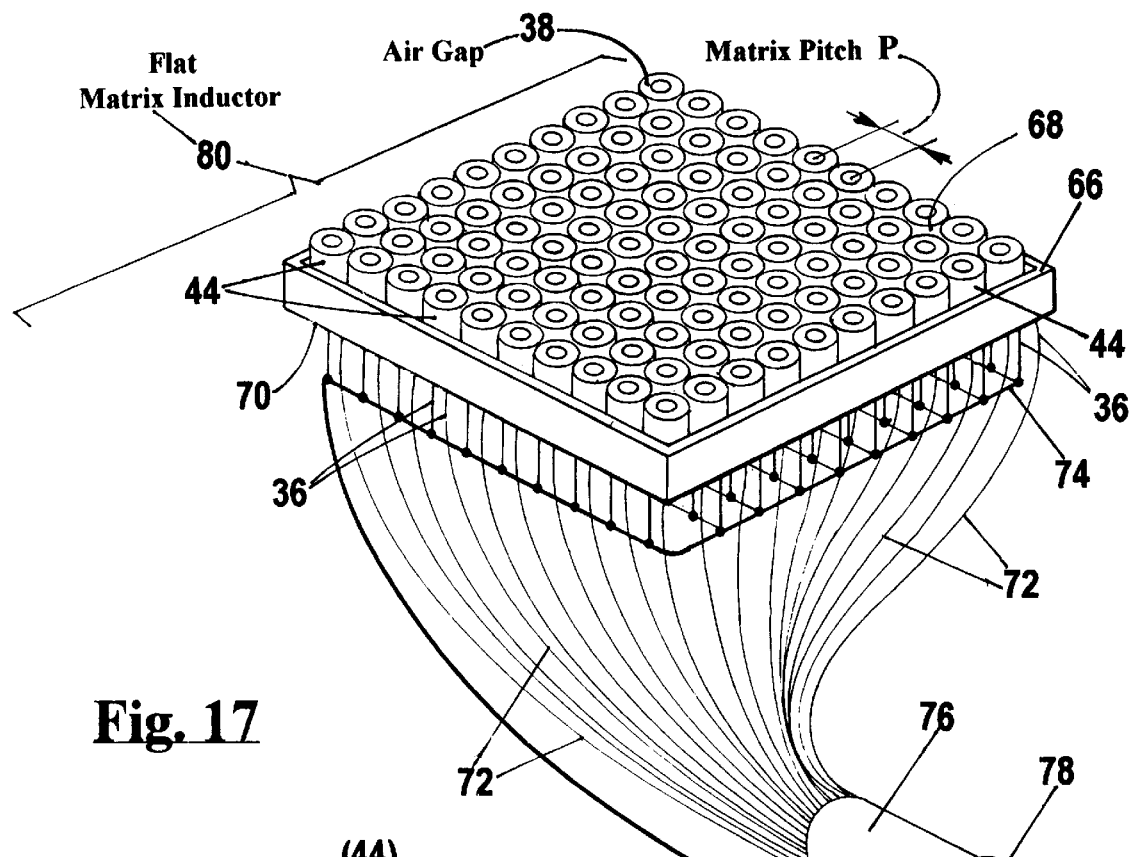
FIG. 17 shows, in perspective view, a multiplicity of cylindrical inductor cells held together by a frame to form a flat matrix inductor.

FIG. 17 shows, in perspective view, a multiplicity of cylindrical inductor cells 44 placed side-by-side conforming to a matrix arrangement and held together by an encircling or holding frame 66. Cells' 44 individual air gaps 38 are all facing in the same direction, upwards, and are all contained on a flat upper surface, or top face 68. From every inductor cell 44, a pair of terminals 36-36 emerges beneath the underside or base face 70. One terminal 36 from each and every inductor cell 44 is outfitted with an extension wire 72. The other remaining terminals 36 are all interconnected together and outfitted with a common extension wire 74. The multiplicity of wires 72 can be bundled into an optional cable harness 76 that terminates into an optional interface connector 78. The grouped assembly comprising the multiplicity of inductor cells 44, frame 66, the multiplicity of wires 72 and wire 74, form what we shall call a flat matrix inductor 80.

Figure 18:
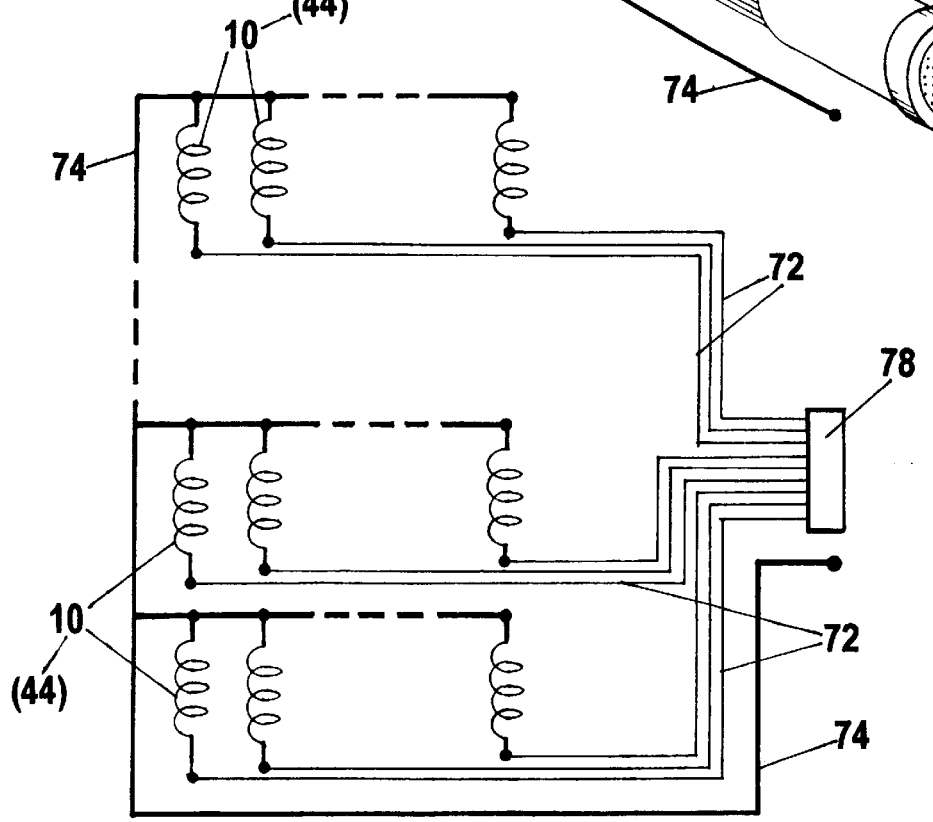
FIG. 18 shows an electrical schematic corresponding to the matrix inductor depicted in FIG. 17.

FIG. 18 shows an electrical diagram representing said inductor 80. In order to simplify the drawing of the figure only nine inductor cells 44 (represented by their solenoids 10) are depicted in FIG. 18, although the matrix may comprise any number of rows and columns. The diagram shows the nine solenoids 10 all interconnected to wire 74 and nine extension wires 72 terminating at an optional connector 78. This arrangement permits an in-parallel connection of two or more inductor cells 44 to an alternating current supply. Connecting each and every inductor cell 44 in a series-circuit is also possible but this particular connection would eliminate operational flexibility and reduce the applicability of this invention.

If an alternating current is simultaneously supplied to every individual inductor cell 44 forming part of matrix inductor 80, a multiplicity of variable magnetic fields 40 (not shown in FIG. 17) will emanate upward from top face 68 forming a—carpet-like magnetic field—of finite thickness. A view toward and perpendicular to top face 68 will reveal that fields 40 leave voids among themselves because inductor cells 44, being cylindrical, cannot uniformly cover the area of top face 68. In some applications it may be preferable that the complete top face of flat matrix inductor 80 be covered by a magnetic field that presents no voids. One manner to achieve this objective is by forming a matrix with hexagonal inductor cells 82 as the one shown, in perspective view, in FIG. 19. A multiplicity of inductor cells 82 when placed side-by-side, will form a honeycomb pattern that when supplied with an alternating current, produces a—carpet-like magnetic field—with no voids. A multiplicity of inductor cells 82 can be cemented together to form a flat matrix inductor eliminating the need for a holding frame 66. As an alternative, rather than cementing individual inductor cells 82, the complete assembly can be molded into a single ferrite part (or fabricated by machining a solid ferrite plate) to form an integral matrix inductor 84 as shown, in top view, in FIG. 20. Other shapes for individual inductor cells such as square, triangular, etc. can be utilized to prevent formation of magnetic field voids on the surface of a matrix inductor. An example of square cells type matrix is shown in FIG. 21, in perspective view.

It should be understood that the operability of my invention is equally effective utilizing any type of matrix inductor comprising a multiplicity of inductor cells grouped in a matrix fashion. Consequently, matrix inductors depicted in FIG. 17, FIG. 20 and FIG. 21 are functionally equivalent. Moreover, the number of inductor cell columns forming a matrix inductor doesn't need to be equal to the number of inductor cell rows.

The top face of an integral matrix inductor 84 can be used as a—work-holder—where a PCB of any size can be held in place by conventional means such as clamping clips, vacuum holding, etc. FIG. 22 shows, in top view, a complete PCB 86 held on the top face of an inductor 84. PCB 86 is fitted with two electronic components, identified as A and B in the figure, resting on its top surface ready to be solder. Component A has leads on opposite sides of its casing (a DIP type component). To accomplish the objectives of my invention, namely to prevent the heating of component A casing, it is required that the variable magnetic fields be limited to be positioned inside the pair of areas 88-88. Each area 88 only encompasses footprint of joints to be soldered.

In operation soldering is achieved by only supplying with an alternating current the individual inductor cells laying, or positioned, underneath areas 88-88. The particular electrical connection that satisfies this requirement will be referred as a predetermined electrical connection.

Similarly, in order to solder component B (which has leads all around its perimeter) only the inductor cells placed beneath (square and centrally hollow) area 90 should be supplied with an alternating current. FIG. 23 is a side view of FIG. 22 that depicts variable magnetic field boundaries 42 engulfing terminations 50 and pads 54 during soldering operation. Obviously, both components A and B can be soldered at the same time by supplying the appropriate (or pertinent) inductor cells with an alternating current. Soldering pads and interconnecting traces existing on the face of complete PCB 86 are not shown in FIG. 22 for sake of clarity.

In practice a PCB may contain hundreds of components that need to be soldered simultaneously. This is achieved by supplying with an alternating current every individual inductor cell laying beneath a join to be soldered, while the remaining inductor cells stay electrically (or electromagnetically) inactive. Again, the particular electrical connection that satisfies this requirement for soldering a plurality of components will be referred as a predetermined electrical connection.

Notice that for a PCB 86 to be properly soldered it should be placed as close as possible to the top face of a flat matrix inductor 84 to allow boundaries 42 to penetrate throughout said PCB 86 thickness (or dielectric material), emerging on its top surface, reaching and engulfing leads, soldering pads and solder paste. The maximum height H that a boundary 42 can develop is limited by the saturation flux density characterizing the ferrite (or equivalent material) forming matrix inductor 84.

In order to fully reap the benefits of my invention it is preferable that the spacing between individual inductor cells, or pitch P characterizing matrix inductor 84 (for visual definition of pitch P see FIG. 22, upper right corner), be about the same magnitude as the size of the smaller lead/pad-combination to be joined by the soldering process. Otherwise, we risk that part of the component's body becomes heated as is illustrated in FIGS. 10 and 11.

Figure 24:
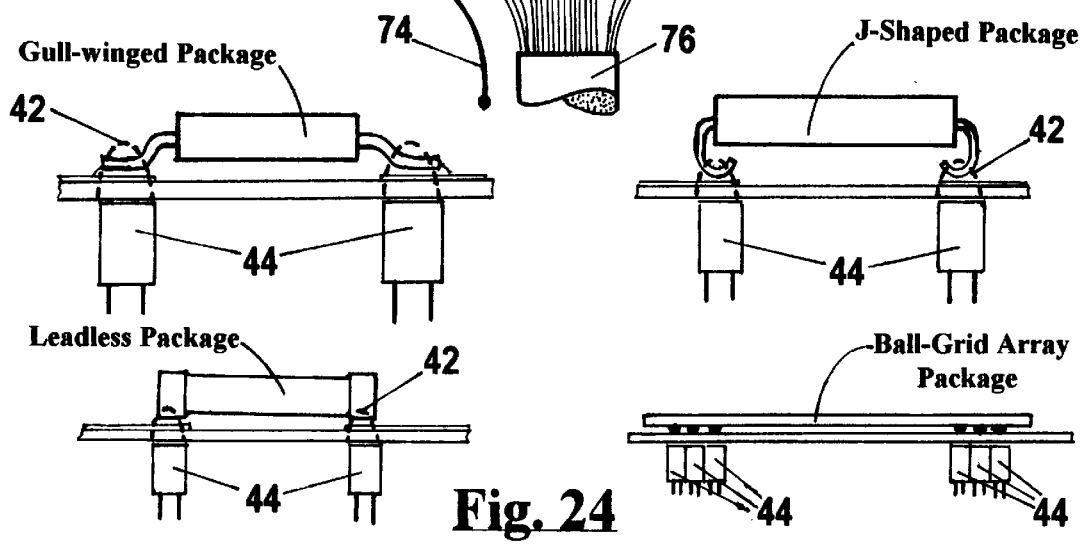
FIG. 24 shows, in side view, four popular electronic component's terminations permitting to compare the size of magnetic field required for soldering each termination.

FIG. 24 shows, in side view, four of the most popular type of leads (or terminations) found with electronic component packages. The figure qualitatively compares the optimum lateral dimension of boundary 42 (or its equivalent, matrix pitch P) to be utilized for each different termination. The gull-winged package allows safe soldering with matrix inductors of relatively large pitch P; the J-shaped package tolerates medium size pitch P; the leadless package needs small pitch P and the ball-grid-array type package requires the smallest pitch P for best results. However, if the size of a lead/pad-combination is larger than the pitch P of the matrix inductor been utilized two or more inductor cells could to be activated to accomplish the soldering operation of that particularly larger joint.

In most applications the components to be soldered on a PCB not only differ and contrast in their individual size but also differ in the individual—thermal mass—of their leads. Consequently, for a given strength of variable magnetic field (measured in ampere-turns per inductor cell), leads with smaller thermal mass will heat up faster than leads with larger thermal mass. To achieve, or attain, the same solder alloy liquidus temperature it is necessary that joints with smaller thermal mass be exposed to said variable magnetic field for a shorter duration of time.

The reader can now recognize that an integral matrix inductor 84, as the one shown in FIGS. 22 and 23, is a versatile and flexible tool that permits to simultaneously solder many different components previously placed on a PCB by supplying an alternating current to the inductors cells laying beneath the joints to be soldered. Each inductor cell should be energized for a predetermined time duration, proportional to the thermal mass of the corresponding joint being soldered.

It can be concluded that both reflow and wave solder equipments presently utilized by the electronic packaging industry for soldering components on PCBs can be replaced by an integral matrix inductor 84 when utilized in the manner described above.

The reflow and the wave solder processes, both, require that all components to be soldered be placed on a PCB prior to initiation of said soldering processes. A typical reflow solder process requires from 5 to 8 minutes to be completed. The same operation can be accomplished in 3 to 6 seconds utilizing an integral matrix inductor 84 in accordance with the manner described above.

Because the localized nature of the heating process and the much shorter heating time required, my invention consumes about 200 times less energy than the reflow and wave processes.

Consequently, due to the significantly shorter process time required by my invention, formation of undesirable intermetallic compounds inside the soldered joint is drastically reduced. Likewise, oxidation of soldered joint and adjacent component surfaces is also reduced. Soldering by E.I.H., as implemented by my invention, is the most energy efficient and advantageous process for assembling electronic products.

In mass production applications, solder paste is precisely deposited on the soldering pads of a PCB by a stencil printing process, then prior to the soldering operation, placement of all electronic components over said PCB is accomplished by an automated computer-controlled—pick-and-place machine—that has a work holder platform where said PCB is held while said machine places different components, one at the time, with high accuracy and high throughput. Typically, the—pick-and-place cycle—for placing a component consumes from 3 to 5 seconds. After all components are placed the completed PCB moves to a different machine where the soldering operation is performed by either the reflow or the wave process.

Notice that, if the work holder (table or platform) of a pick-and-place machine is replaced by an integral matrix inductor, as the one shown in FIG. 22, or alternatively said integral matrix inductor is attached to said work-holder, to perform as new work-holder of said pick-and-place machine, the soldering of each component can be safely accomplished, one at the time, during each individual pick-and-place cycle that said pick-and-place machine performs. The soldering operation of an individual component utilizing my invention requires about the same time as a pick-and-place cycle duration.

During a pick-and-place cycle, a component is grabbed and held by a vacuum cup that is the termination end of said machine's—pick-and-place head. A pick-and-place cycle terminates by releasing the component on said PCB at a predetermined location. If the component is held in place by the pick-and-place head (vacuum cup) during the melting and solidification of solder alloy, any possible movement of the component while being soldered is eliminated. The ability to restrain a component while been soldered (by working in cooperation with a pick-and-place machine) is a very important and unique advantage that can only be accomplished with my invention (without the use of pre-placed holding clips or adhesives).

Normally, a component being soldered by the reflow process is prone to move during the soldering cycle under the action of unbalanced forces due to liquid solder surface tension, component buoyancy while solder is liquefied, solder running from pads into traces, forces generated by forced-convection gas flow, equipment vibration, environment noise, etc. A part that moves during the soldering cycle results in misalignment between pads, solder paste and leads. Such a movement could cause weak joints, open joints and solder bridging (or shorts) between adjacent pads and/or traces. The wave process also involves risk of components movement.

An additional unique advantage that can only be accomplished with my invention is the ability to perform solder-quality tests immediately after each component has been soldered. If a defect is found (after the respective pick-and-place cycle is completed), the joint can be re-melted without removing the PCB from the matrix inductor.

Figure 25:
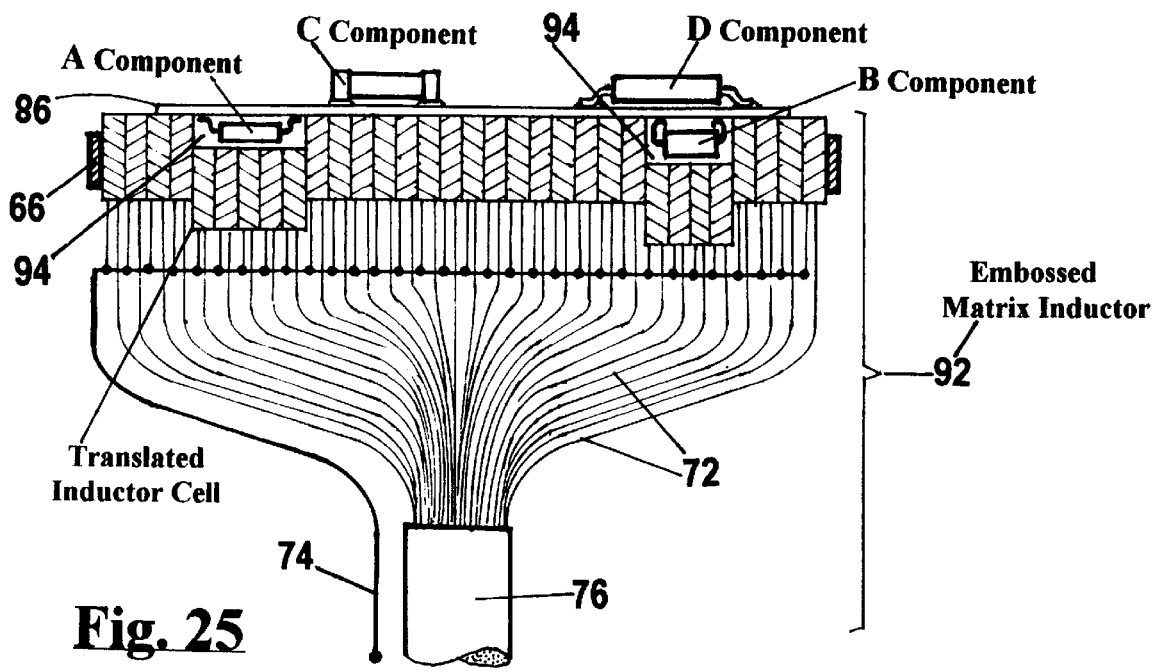
FIG. 25 shows, in cross-sectional side view, a non-flat or embossed matrix inductor.
Figure 26:
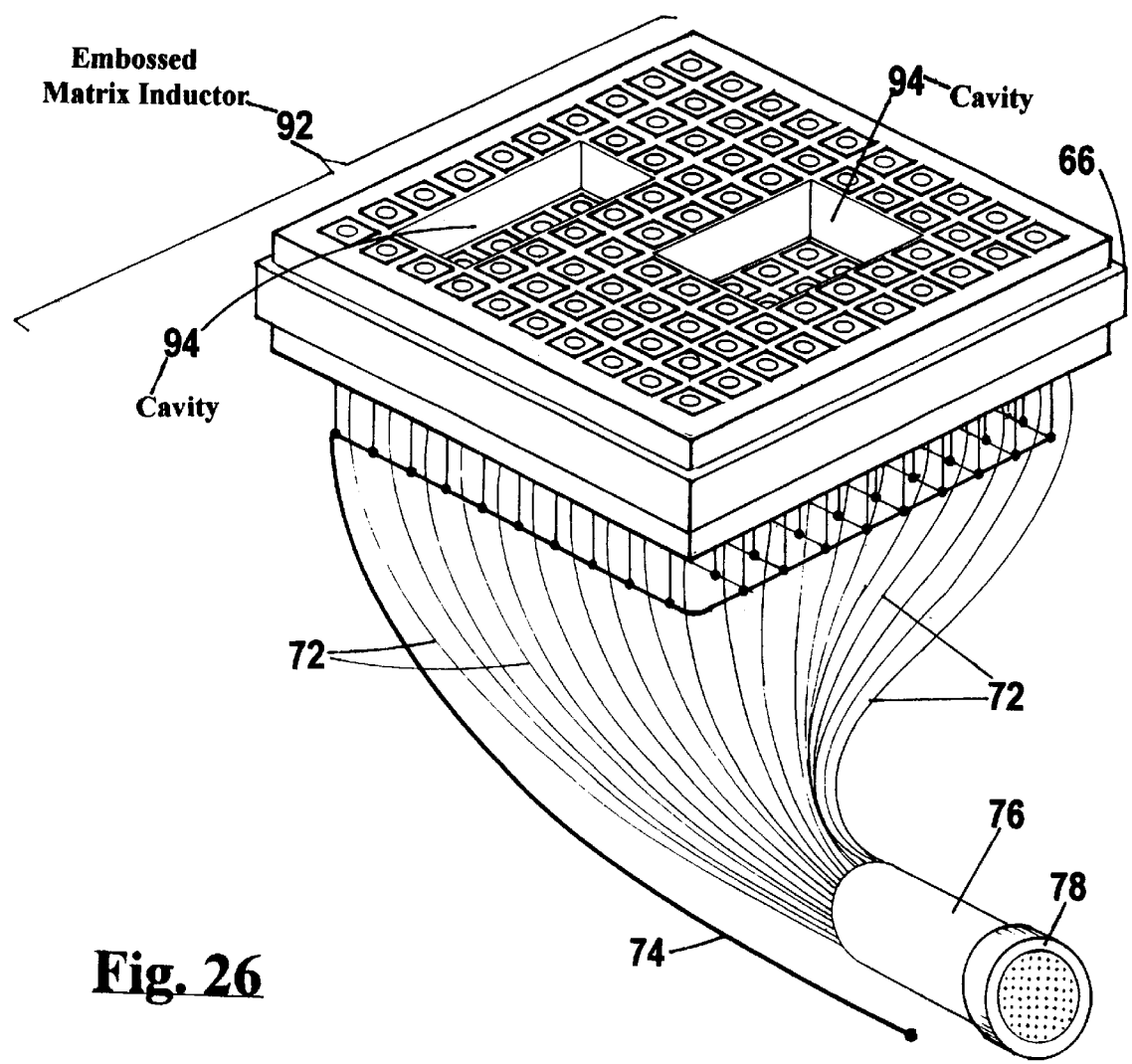
FIG. 26 shows, in perspective view, an embossed matrix inductor depicting two recessed cavities.

The reader should realize that soldering operations achievable with an integral matrix inductor, as described above, are only applicable to single-sided PCBs, namely to those boards containing no components already soldered or placed on the PCB face that should rest on top of said integral matrix inductor. This limitation on the applicability of a—flat-faced—integral matrix inductor is circumvented by re-positioning, away from the face of said matrix inductor, some individual inductor cells such as to form cavities, or recessed niches, conforming to the topography of the components already soldered on a PCB. To illustrate this solution, assume a PCB 86 that has two components, A and B, already soldered on one surface and that it is necessary to solder additional components on its opposite surface. FIG. 25 shows, in cross-sectional side view, said PCB 86 resting on top of a—non-flat—or embossed matrix inductor 92 that is intentionally shaped with two recessed cavities 94-94 tailored to avoid contact of inductor 92 with components A and B, while maintaining proximity to them. Cavities 94-94 are obtained by sliding, or translating, an appropriate number of individual inductors cells and restraining them in that translated position by a frame 66. On the top surface of PCB 86 there are two components identified as C and D ready to be soldered. In order to solder components C and D it is necessary to supply an alternating current to all the—untranslated—inductor cells laying directly underneath lead/pad-combination footprints in the same manner previously described for soldering components A and B shown in FIG. 22. The translated inductor cells (that form the base or ceiling of cavities 94—94) must remain electrically inactive to prevent heating of components C and D casings. FIG. 26 shows, in perspective view, the face of a typical inductor 92 arranged with two cavities 94—94.

The reader can now recognize that an embossed matrix inductor, as the one shown in FIGS. 25 and 26, is a versatile and flexible tool that allows to simultaneously solder many different components previously placed on a double-sided PCB by supplying an alternating current to the—untranslated—inductors cells laying exactly beneath the joints to be solder. In other words the individual inductor cells must be connected to an alternating current in a predetermined electrical manner. Each inductor cell should be supplied for a time duration proportional to the thermal mass of the corresponding joint being soldered.

It can be concluded that, both reflow and wave soldering equipments presently utilized by the electronic packaging industry for soldering components on double-sided PCBs, can be replaced by an embossed matrix inductor 92 when utilized in the manner described above.

The reader should realize that if the work holder (table or platform) of a pick-and-place machine is replaced by an embossed matrix inductor 92, the soldering of each component can be safely accomplished, one at the time, during each individual pick-and-place cycle as was previously described in detail when utilizing an integral matrix inductor 84 (case of FIGS. 22 and 23).

Figure 27:
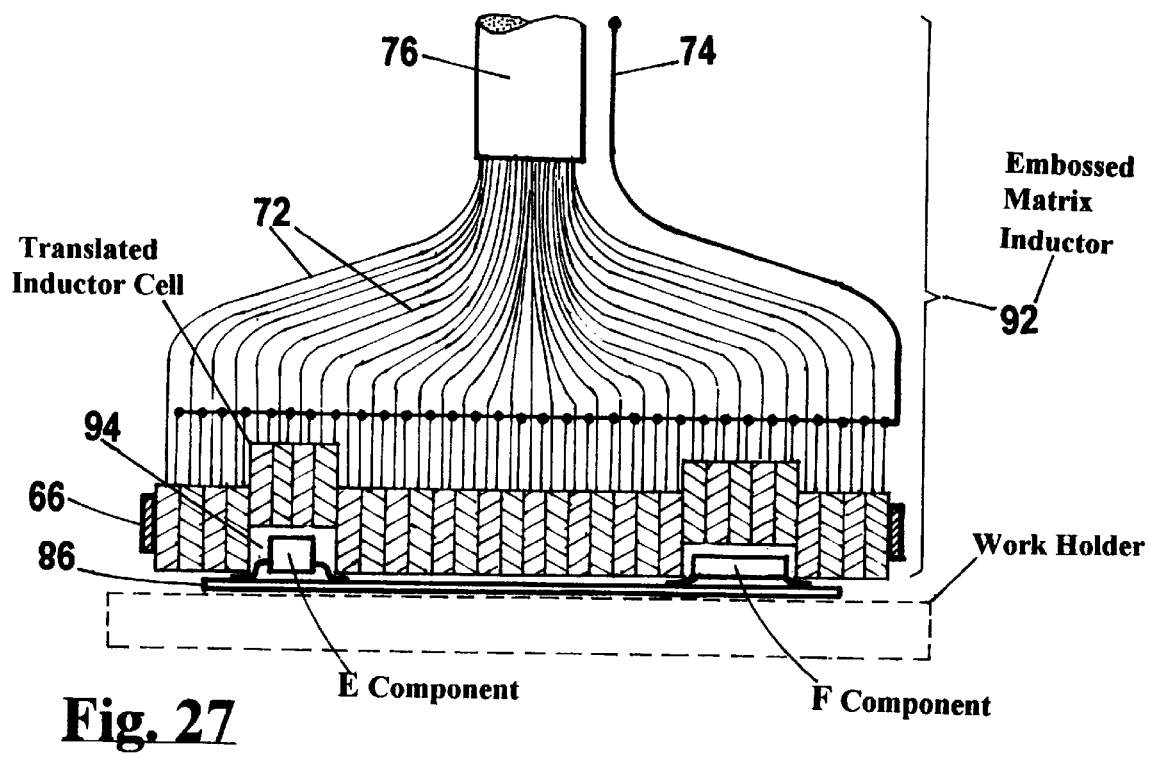
FIG. 27 shows, in cross-sectional side view, an embossed matrix inductor properly placed on top of a PCB to perform a soldering operation.

In the preceding description of my invention, both the integral matrix inductor and the embossed matrix inductor are placed underneath of a PCB to be soldered, thus acting as a work-holder. Variable magnetic fields reach (and engulf) the joints to be soldered after traversing through the thickness of said PCB. Contrariwise however, an embossed matrix inductor can be placed on top of a PCB after all components to be soldered are placed on its surface. In this case the distribution of cavities (or indentations, or dimples) must conform to the topography of the multiplicity of components to be soldered such as to avoid physical contact with them, but sufficiently nearby to them so that the variable magnetic fields (emanating downward) are capable of engulfing the joints to be soldered. FIG. 27 shows, in cross-sectional side view, a setup where an embossed matrix inductor 92 is placed—facing down—on top of a PCB 86 which has two components, E and F ready to be soldered. The face of inductor 92 does not need to touch the joints to be soldered. In operation, variable magnetic field boundaries 42 (not shown in FIG. 27) engulf the joints to be soldered reaching them from above (no via the PCB thickness).

The reader can now recognize that an embossed matrix inductor, as the one shown in FIG. 27, is a versatile and flexible tool that permits to simultaneously solder many different components previously placed on a PCB by supplying an alternating current to the—untranslated—inductors cells laying exactly above the joints to be soldered, in other words the individual inductor cells must be connected to an alternating current in a predetermined electrical manner. Each inductor cell should be supplied for a predetermined time duration proportional to the thermal mass of the corresponding joint being soldered.

The above described embossed matrix inductor 92, is intended to be a versatile and flexible tool, primarily conceived for soldering double-sided PCBs. Any embossed matrix inductor 92 can be—re-configured—as many times as needed to comply with (or adapt to) the topography of any specific distribution of components to be soldered into a PCB. This capability is desirable for quick turn-around prototyping and short-run manufacturing, in cases of mass production applications it may be preferable to have a—dedicated or tailored—embossed matrix inductor that indeed can be designed to be more precise and accurate for a specific soldering application.

Figure 28:
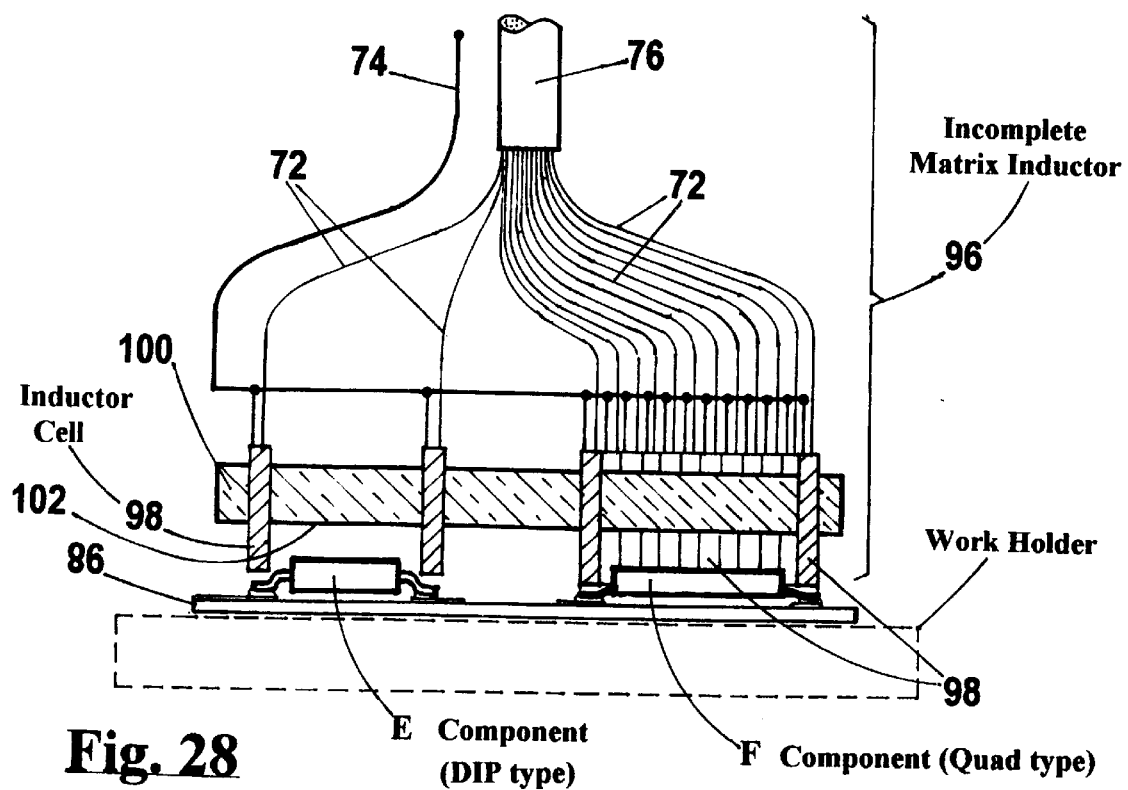
FIG. 28 shows, in cross-sectional side view, an incomplete matrix inductor properly placed on top of a PCB to perform a soldering operation.
Figure 29:
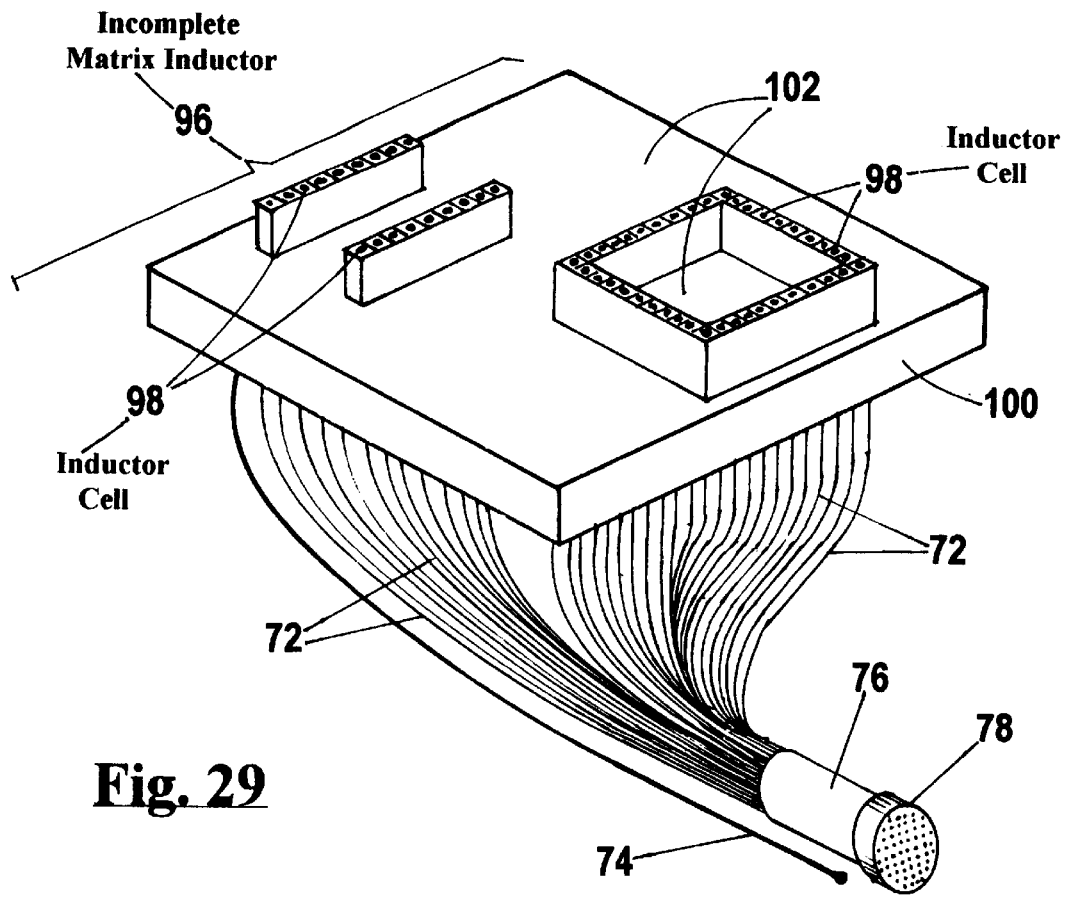
FIG. 29 shows, in perspective view, the matrix inductor shown in FIG. 28 clearly depicting its features.

FIG. 28 shows, in cross-sectional side view, a PCB 86 that has two components, E and F, ready to be soldered. An incomplete matrix inductor 96 is placed above and close to PCB 86 and components E and F, but without touching them. Incomplete matrix inductor 96 comprise a plurality of inductor cells 98 not arranged in a matrix configuration. Said inductor cells 98 are placed or distributed, such that each lays directly above a joint to be soldered. The space between inductor cells 98 is occupied by a rigid filler-material 100 whose main purposes are to restrain cells 98 from moving and to form an integral structure. Filler-material 100 forms recessed space (or cavities or a ceiling) 102 that conforms with the topography of components to be soldered. In other words, incomplete matrix inductor 96 is an integral unit configured for soldering a particular PCB. FIG. 29 shows, in perspective view, incomplete matrix inductor 96 clearly depicting the absence of inductor cells that are totally unnecessary for soldering components E and F in FIG. 28. Because there is no need to form a matrix, the individual inductor cells 98 forming inductor 96 don't need to be of the same physical size, therefore cells 98 can be selected to vary in lateral dimension or size (or pitch P) in accordance to the size of different joints to be soldered.

Figure 30:
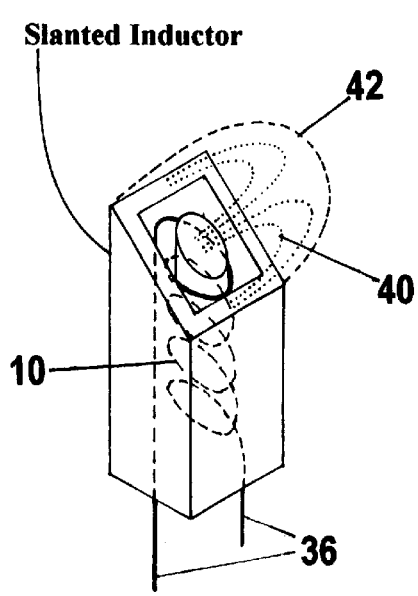
FIG. 30 shows, in perspective view, a slanted inductor.
Figure 31:
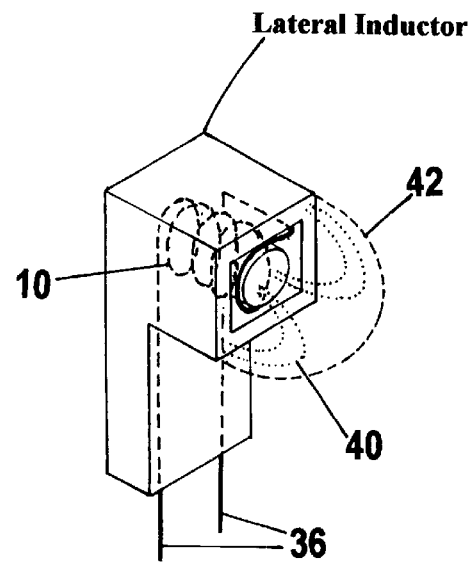
FIG. 31 shows, in perspective view, a lateral inductor.

An incomplete matrix inductor, though restricted to a specific soldering application however, for that application, offers the most efficient soldering alternative because it permits to incorporate inductors of different size and different types. For example, FIG. 30 shows, in perspective view, a slanted inductor characterized by producing a field 40 inclined with relation to the inductor's vertical axis. This configuration is preferred for soldering J-shaped packages. FIG. 31 shows, in perspective view, a lateral inductor characterized by producing a field 40 that emanates at about 90° with the inductor's vertical axis permitting to achieve orthogonal soldering operation. Both, slanted and lateral inductors can comprise an incomplete matrix inductor.

Furthermore, some inductors can be constructed with coils 10 having different number of turns than other cells. A cell having different number of turns will exert a magnetomotive force (given in ampere-turns) different than that exerted by other cells. This permits to adjust the height H of boundary 42 (see FIG. 7) to better fit said height H to a particular joint geometry. In other words, an incomplete matrix inductor can be designed to simultaneously incorporate different types of inductors, from relatively small to relatively large inductor (or from small to large individual pitch P) and/or coils 10 of different number of turns in the same unit so as to optimize a particular solder operation.

The reader should realize that an incomplete matrix inductor can be placed underneath of a single-sided PCB to perform solder operation in a manner similar to case of FIGS. 22 and 23.

The reader should also realize that; if the work holder (table or platform) of a pick-and-place machine is replaced by an incomplete matrix inductor 96, the soldering of each component can be safely accomplished, one at the time, during each individual pick-and-place cycle as was previously described in detail when utilizing an integral matrix inductor 84 (case of FIGS. 22 and 23).

In the following description it should be understood that the term flat matrix inductor indistinctly refers or applies to, each and any matrix inductors 80 or 84 depicted in FIG. 17, FIG. 20 and FIG. 21 or any functionally equivalent matrix inductor. The term embossed matrix inductor refers or applies to, an embossed matrix inductors 92 as depicted in FIGS. 25 and 27 or any functionally equivalent inductor unit. The term incomplete matrix inductor refers to an incomplete matrix inductor 96 as shown in FIGS. 28 and 29 or comprising different types of inductor cell and/or variable pitch P and/or coils 10 of different number of turns. The term individual cell refers to one of the multiple inductor cells that comprise either a flat matrix inductor, an embossed matrix inductor or an incomplete matrix inductor.

Description of Invention in Preferred Embodiments

Figure 32:
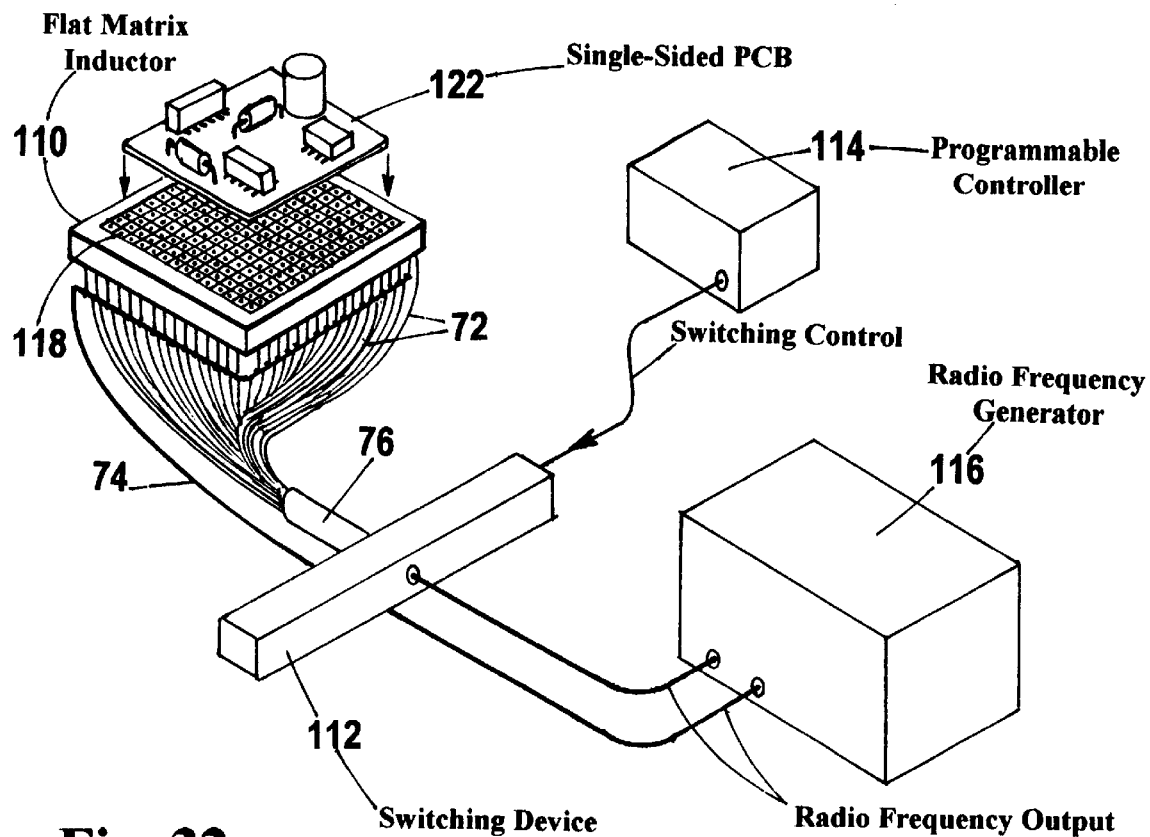
FIG. 32 shows, in perspective view, an embodiment of this invention comprising a flat matrix inductor.
Figure 33:
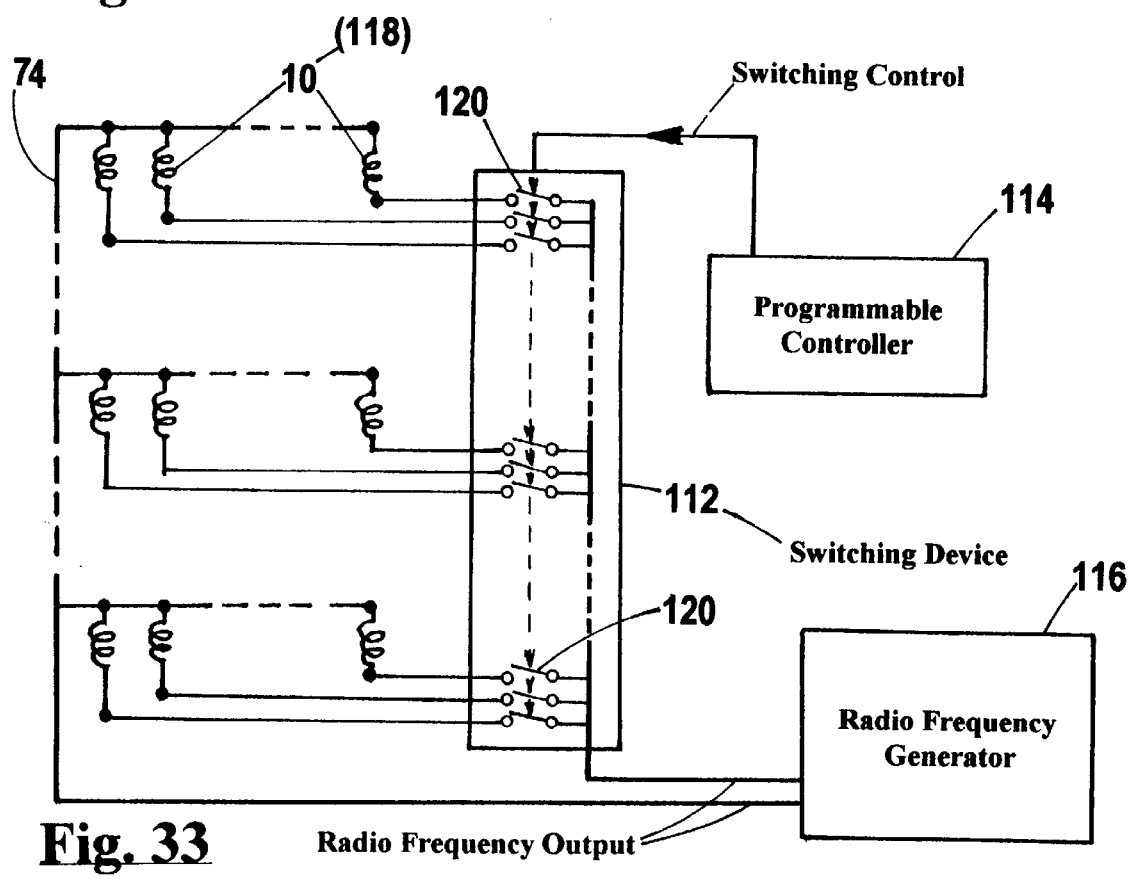
FIG. 33 shows an electric block-diagram corresponding to FIG. 32.

Referring now specifically to the entirety of my invention, a typical embodiment of my invention is shown in FIG. 32 illustrated in accordance with the objectives of my invention by comprising a flat matrix inductor 110, a switching device 112, a programmable controller 114 and a radio-frequency generator 116. Inductor 110 consists of a multiplicity of individual cells 118, each cell 118 is capable of being electrically connected in parallel to generator 116 by means of device 112. Device 112 comprises a multiplicity of single-pole switches 120 that are capable of connecting each cell 118 to generator 116 independently of other cells 118 for a different duration of time under control, or instruction, exerted by said controller 114 upon said device 112. Generator 116 is capable of supplying an alternating current controllable in intensity and frequency. FIG. 33 shows an electrical schematic corresponding to the embodiment illustrated in FIG. 32. Device 112 comprises a plurality of single-pole switches 120 (preferably of the normally open type). Switches 120 could be of various type; either mechanical toggle-switch, electromechanical relay or solid-state relay. Said controller 114 could be of various kinds; mechanical, electromechanical or solid state type.

In operation, a single-sided PCB 122 including a multiplicity of diverse electronic components ready to be soldered is placed and held on the top face of said inductor 110, subsequently said generator 116 is activated and then every particular switch 120, that connects an individual cell 118 positioned under a joint to be soldered, is closed for a predetermined time duration sufficiently long to achieve melting of solder alloy to successfully solder the corresponding joints. Said particular switches 120 can all be closed simultaneously or in a sequential grouped manner.

Notice that said controller 114 can be eliminated from the above embodiment; in that case, device 112 is manually preset to connect generator 116 to inductor 110 in a predetermined electrical manner. Furthermore, said inductor 110 could be directly connected (hard wired) to said generator 116 eliminating the need for both, said device 112 and said controller 114. Both embodiments will connect all individual cells positioned under joints to be soldered for the same time duration. This approach is acceptable and efficient when all the joints to be soldered exhibit almost identical thermal mass.

Figure 34:
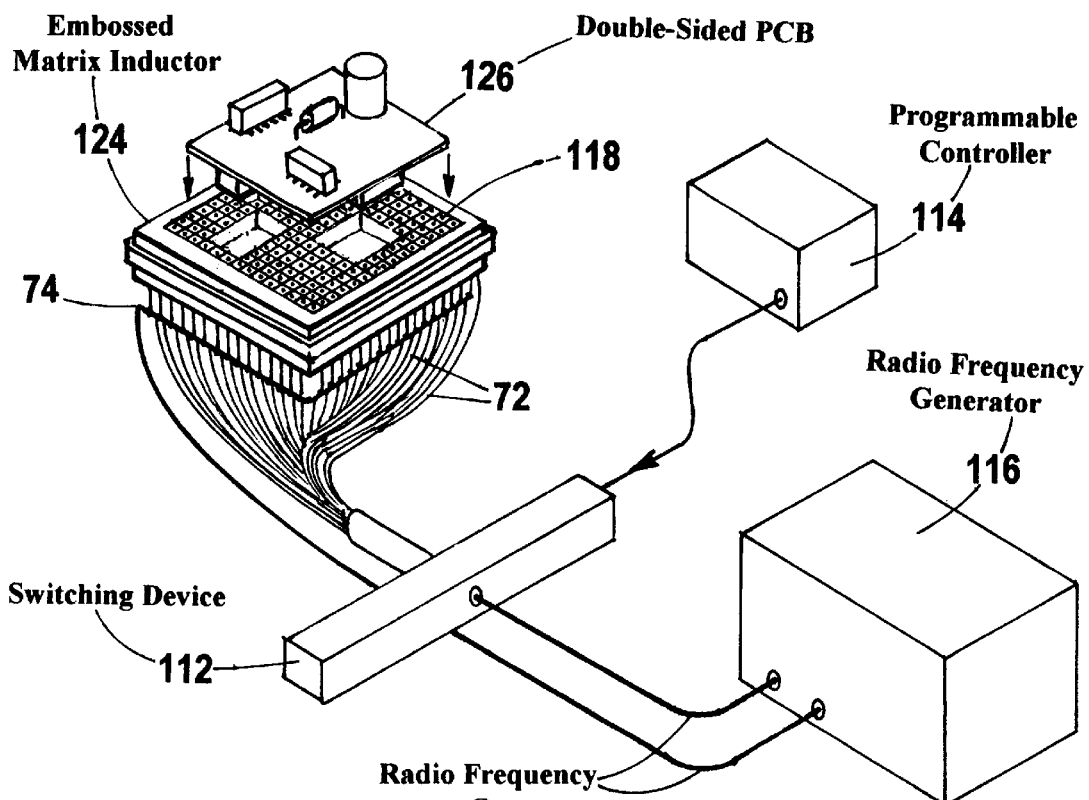
FIG. 34 shows, in perspective view, an embodiment of this invention comprising an embossed matrix inductor.

Another embodiment of my invention is shown in FIG. 34 illustrated in accordance with the objectives of my invention by comprising an embossed matrix inductor 124, a switching device 112, a programmable controller 114 and a radio-frequency generator 116. Inductor 122 consists of a multiplicity of inductor cells 118, each individual cell 118 is capable of being electrically connected in parallel to generator 116 by means of device 112. Device 112 comprises a multiplicity of single-pole switches 120 and is capable of connecting each individual cell 118 to generator 116 independently of other individual cells 118 for a different duration of time, by the action of said programmable controller 114. Generator 116 is capable of supplying an alternating current controllable in intensity and frequency. The electrical schematic corresponding to the embodiment illustrated in FIG. 34 is the same already described and illustrated in FIG. 33.

In operation, a double-sided PCB 126 including a multiplicity of diverse electronic components ready to be soldered is placed and held on the top face of said inductor 124. Subsequently, said generator 116 is activated and then every switch 120 that connects an individual cell 118, positioned under a joint to be soldered, is closed for a predetermined time duration sufficiently long to achieve melting of solder alloy and successfully solder the corresponding joint. Said particular switches 120 can all be closed simultaneously or in a sequential grouped manner.

Notice that said controller 114 can be eliminated from the above embodiment. In that case, device 112 is manually preset to connect generator 116 to inductor 124 in a predetermined electrical manner. Furthermore, said inductor 124 could be directly connected (hard wired) to said generator 116 eliminating the need for both said device 112 and said controller 114. Both embodiments will connect all individual cells positioned under joints to be soldered for the same time duration. This approach is acceptable and efficient when all the joints to be soldered exhibit almost identical thermal mass.

Figure 35:
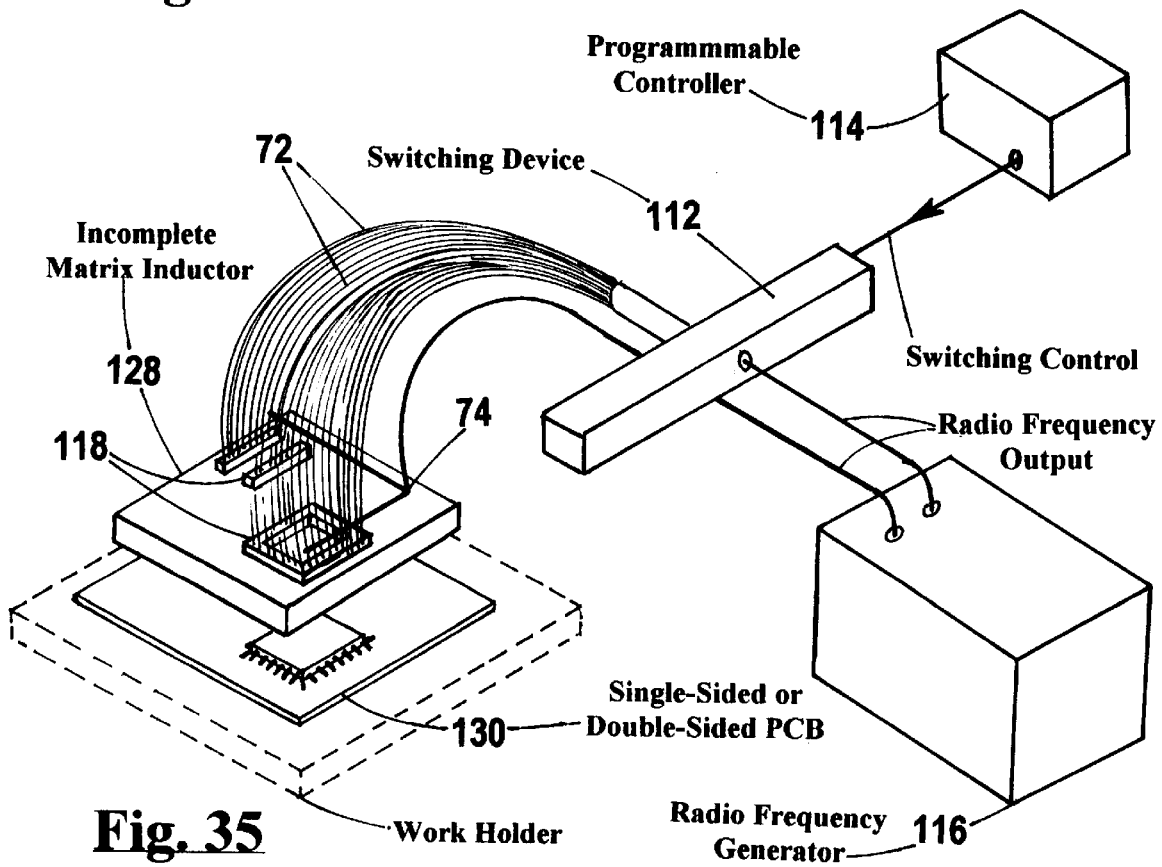
FIG. 35 shows, in perspective view, an embodiment of this invention comprising an incomplete matrix inductor.

Another embodiment of my invention is shown in FIG. 35 illustrated in accordance with the objectives of my invention by comprising an incomplete matrix inductor 128, a switching device 112, a programmable controller 114 and a radio-frequency generator 116. Inductor 128 consists of a multiplicity of inductor cells 118. Each individual cell 118 is capable of been electrically connected, in parallel, to generator 116 by means of device 112. Device 112 includes a multiplicity of single-pole switches 120 and is capable of connecting each individual cell 118 to generator 116 independently of other individual cells 118, for a different duration of time, by action or command of said controller 114. Generator 116 is capable of supplying an alternating current controllable in intensity and frequency. The electrical schematic corresponding to the embodiment illustrated in FIG. 35 is the same already described and illustrated in FIG. 33.

In operation, either a single-sided or a double-sided PCB 130 including a multiplicity of electronic components ready to be soldered, is placed on a suitable work-holder with the components to be soldered facing up. Said inductor 128 is placed on top of said PCB 130 in the proper aligned position without touching it; subsequently, said generator 116 is activated and every switch 120 is closed. A particular switch 120 is closed for a predetermined time duration to account for the particular thermal mass of the joint positioned under cell 118 associated with said particular switch 120. Said particular switches 120 can all be closed simultaneously or in a sequential grouped manner.

Notice that said controller 114 can be eliminated from the above embodiment. In that case, device 112 is manually preset to connect generator 116 to inductor 128 in a predetermined electrical manner. Furthermore, said inductor 128 could be directly connected (hard wired) to said generator 116 eliminating the need for both said device 112 and said controller 114. Both embodiments will connect all individual cells positioned under joints to be soldered for the same time duration. This approach is acceptable and efficient when all the joints to be soldered exhibit almost identical thermal mass.

Figure 36:
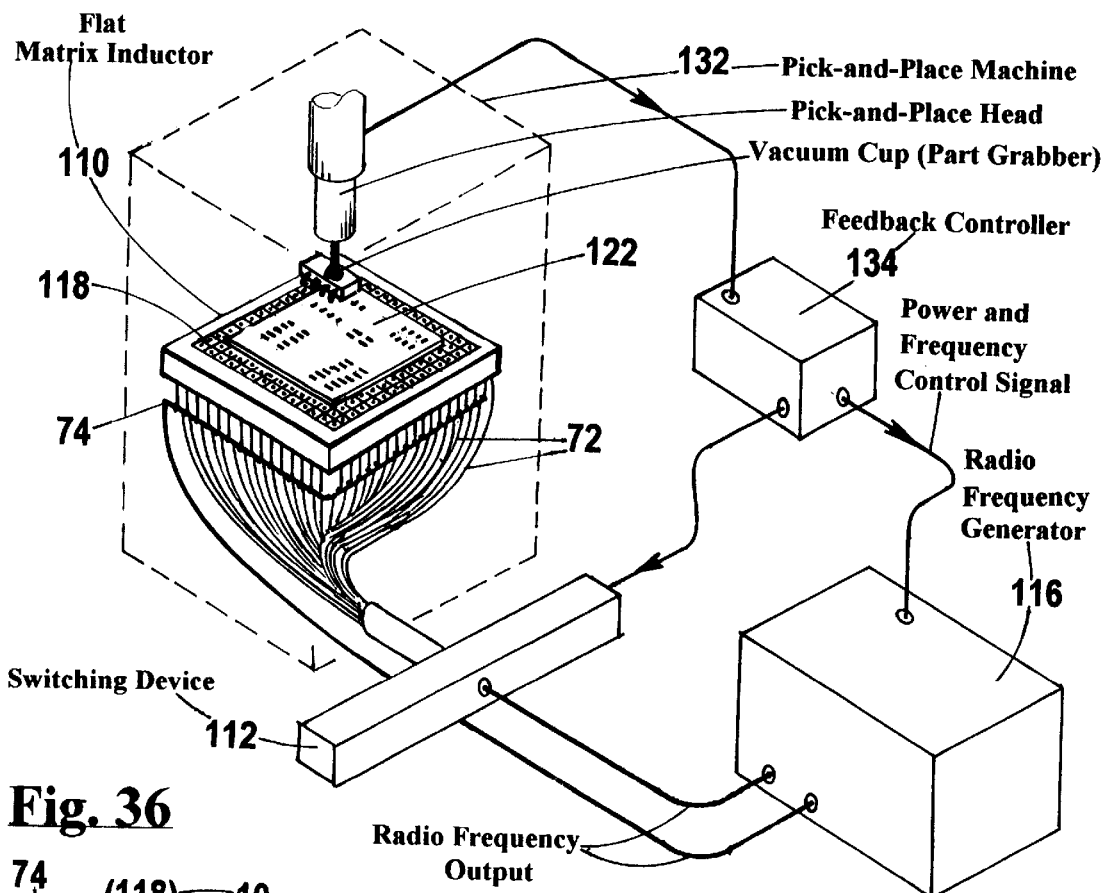
FIG. 36 shows, in perspective view, an embodiment of this invention comprising a flat matrix inductor replacing the work-holder in a commercially available pick-and-place machine.

Another embodiment of my invention is shown in FIG. 36 illustrated in accordance with the objectives of my invention by comprising a commercially available pick-and-place machine 132, a flat matrix inductor 110 attached to and acting as the work-holder of said pick-and-place machine 132, a switching device 112, a feedback controller 134 and a radio-frequency generator 116. Inductor 110 consists of a multiplicity of inductor cells 118; each individual cell 118 is capable of been electrically connected, in parallel, to generator 116 by means of device 112. Device 112 comprises a multiplicity of single-pole (preferably) solid-state switches 136 that are capable of connecting each individual cell 118 to said generator 116, independently of other individual cells 118 for a different duration of time by the action (or under the command) of said controller 134. Controller 134 receives, and/or extracts, encoded digital signals (or data) normally generated or provided by said pick-and-place machine 132 identifying: (a) the time when a particular component is been acquired or picked up (b) which particular component is been pick-and-placed during each cycle, (c) the placement coordinates on a PCB, (d) the time when a component is placed down on a PCB and (e) the time when a component is released. This data is used by controller 134 to instruct device 112 when to close and then to open a particular switch 136. Controller 134 can also instruct generator 116 to: (a) turn itself on and off during pick-and-place cycles, (b) to deliver a predetermined level of alternating current and (c) to deliver a predetermined current frequency. Generator 116 is capable of supplying an alternating current controllable in intensity and frequency.

It is preferable that generator 116 be a current-regulated type because this mode implies that the magnetomotive force (given in ampere-turns) exerted by an inductor cell is indeed regulated.

By controlling the intensity and/or the frequency of said alternating current (during a soldering cycle) it is possible to control the rate of solder solidification. Empirical experience demonstrates that more robust joints are obtained by properly controlling said solidification rate.

Figure 37:
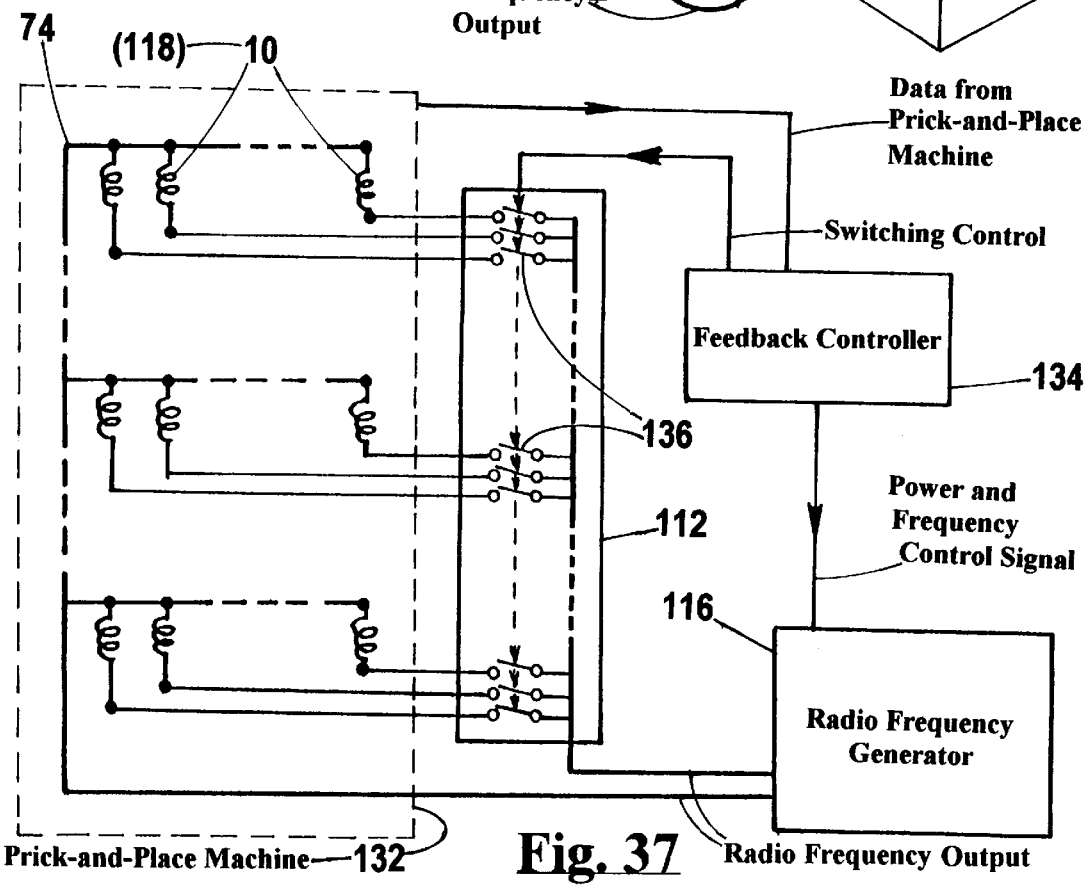
FIG. 37 shows an electric block-diagram corresponding to the embodiment shown in the preceding FIG. 36.

The electric block diagram corresponding to the embodiment illustrated in FIG. 36 is depicted in FIG. 37.

In operation, a single-sided PCB 122 comprising a multiplicity of pads covered with adequate amount of solder paste is held on the top face of said inductor 110. During each pick-and-place cycle that said pick-and-place machine 132 performs, said generator 116 is activated (turned on) and every switch 136 that connects an individual cell 118 positioned under the joints of the particular component been placed during said pick-and-place cycle, is closed for a time duration sufficiently long to achieve melting of solder alloy in the corresponding joints. Both, generator 116 and switches 136 are controlled under command or instruction received from controller 134. The procedure is repeated during every pick-and-place cycle, step by step, until the last component is placed and soldered into said PCB 122.

Summary, Ramifications, and Scope of Invention

Accordingly, the reader will see that this invention is a truly innovative one that provides the electronic manufacturing or electronic packaging industry with a new, safe, reliable and useful device for soldering electronic components (surface-mount and through-hole types) into a PCB. Since during soldering operation my device heats only the leads and pads to be joined by solder, the utilization of my invention offers the following advantages:

permits to solder components to a PCB while the casing, or main body, of the components and the PCB's dielectric-material remain unheated.

permits significant process-time reduction by allowing to solder electronic components to a PCB up to fifty times faster than conventional wave or reflow processes.

reduces manufactured-product cost because much cheaper components (rated for exposure to relatively low temperature environment) are adequate for use with my invention.

improves the reliability of manufactured products.

reduces formation of intermetallic layer inside soldered joint thus improving joints robustness.

allows to control the rate of solder solidification resulting in yet more robust soldered joints.

permits in-process, and in-situ, testing of soldered joints quality thus enabling rework before final assembly of PCB is completed.

provides for a useful de-soldering device.

can be integrated into a commercially available pick-and-place machine dramatically improving the capability of such machine.

reduces the energy consumption by about 200 times with respect to the reflow and wave processes.

reduces the required manufacturing floor space.

Although the above description contains many specificities, these should not be construed as limiting the scope of the invention but as merely providing illustrations of some of the presently preferred embodiments of this invention. Many other variations are possible.

For example; in order to achieve the most efficient transmission of energy from a radio frequency supply, or from generator 116, into a coil 10 (part of an individual cell 118 or an equivalent), radio frequency engineering practice teaches that each individual coil, or set of coils, should be part of a circuit tuned, or resonating, at the specific supplied frequency. This desirable condition can be met (or approximately met) by adding to each individual coil 10 (or to a set of coils) an individual capacitor connected in parallel .

Routinely, this tuning capacitor is supplied as part of any commercial E.I.H. equipment, or as part of generator 116, in the form of a bank of switchable capacitors. Switching capacitors is a standard practice that allows to select the appropriate capacitance value for each particular heating application or for each heating step. However, when a multiplicity of coils 10, or a set of coils, need to be individually tuned, it is desirable to permanently position said capacitors away from the radio frequency generator and very close to each coil, or to a set of coils. This option allows for a more precise tuning of every independent circuit that is part of a coil 10, or a set of coils, thus resulting in an optimum matching of impedances between the radio frequency generator 116 and each coil. Matched impedances results in maximum energy transfer between radio frequency generator 116 and coils. This approach results in compactness that, in turn, allows for the reduction of losses due to parasitic inductance associated with lengthy interconnections. Specifically, it is desirable that all extension wires 72 and the common extension wire 74 (depicted in FIGS. 17, 18, 21, 23, 25, 26, 27, 28, 29, 32, 34, 35 and 36) be replaced by individual coaxial cables to prevent electromagnetic coupling among different coils and/or set of coils.

In order to tune each coil, or set of coils, to a desired frequency, the capacitance of each capacitor must be individually selected accounting for the "effective" inductance of each coil. Notice that in order to calculate, or estimate, the effective inductance of any coil it is necessary to account for the magnetic coupling, or magnetic load, imposed on the coil by the leads-and-pads to be soldered. In particular; size, geometry, magnetic permeability and electric resistivity of the joints influence the magnetic coupling and thus the effective inductance (combined coil plus load inductances).

During a heating cycle the magnetic permeability and/or electric resistivity of the joints being heated may vary, therefore the resonant frequency may not remain constant. Efficient power transmission can be maintained by accordingly varying the supplied frequency or by tuning the circuit to an average frequency.

The compactness attained with the above tuning approach facilitates the compliance with regulations of the Federal Communication Commission for Industrial Heating Equipment, as well as specifications of Occupational Safety and Health Standards (OSHA), NEMA and others.

Also, during continuous soldering duty all types of matrix inductors (including their coils 10) may require active cooling to remove heat generated by hystereses and joule effects.

In another example of variations, a embossed matrix inductor can be used in combination with a flat matrix inductor to hold a PCB sandwiched between them so as to effectuate soldering by providing variable magnetic fields reaching from both faces of said PCB. My invention is equally applicable to multi-layers PCBs. My invention is not limited to PCBs and substrates that are rigid, it is equally applicable to the soldering of components into flexible circuits or the soldering of a flexible circuit into a PCB. Another example is the application of my invention in other processes such as curing of adhesives and curing of conductive epoxy by utilizing heat induced into a susceptor material embedded in (or contacting) the substance to be cured. My invention is also useful for soldering, brazing and heat treatment complex non-electronic products.

Accordingly, the scope of my invention should be determined by the appended claims and their legal equivalents, rather than by the embodiments illustrated.

In reading the claims appended hereinafter it must be understood that the terminology, or word,—matrix inductor—indistinctly refers, applies and describes either a flat matrix inductor, an embossed matrix inductor or an incomplete matrix inductor as described by the above preferred embodiments. This grouping of my novel inductors under a single name, or kind, is solely and merely intended to reduce the number of redundantly independent claims but not as limiting the scope of the invention.

I claim:

1. An apparatus for inductively soldering electronic components to a PCB in a automatic robotic fashion, comprising:

(a) a pick-and-place machine having a work-holder, and (b) a matrix inductor attached to the work-holder of said pick-and-place machine to act as its new work-holder, said matrix inductor comprising a multiplicity of inductor cells, and (c) a radio-frequency generator having a power output, and (d) a switching device for selectively connecting said power output of said radio-frequency generator to any of said multiplicity of inductor cells of said matrix inductor according to a pick-and-place cycle executed by said pick-and-place machine, and (e) a feedback controller connected to said radio-frequency generator and said switching device, during each subsequent pick-and-place cycle obtains specific data identifying said pick-and-place cycle and uses said data to drive or instruct said switching device to selectively connect the power output of said radio-frequency generator to any of said multiplicity of inductor cells of said matrix inductor in a predetermined electrical connection and at a predetermined time for a predetermined time duration whereby in operation, after a PCB is placed on said matrix inductor only the joints being soldered during each subsequent pick-and-place cycle are heated while the body of the electronic component being soldered, components already soldered and the dielectric material of the PCB and its interconnecting traces all remain relatively cold.

2. The apparatus of claim 1 wherein said feedback controller turns-on and then turns-off said radio-frequency generator during each of said subsequent pick-and-place cycle.

3. The apparatus of claim 2 wherein said feedback controller instructs said radio-frequency generator to deliver a predetermined alternating-current intensity during each of said subsequent pick-and-place cycle.

4. The apparatus of claim 3 wherein said feedback controller instructs said radio-frequency generator to change or regulate during each of said subsequent pick-and-place cycle the intensity of said predetermined alternating-current.

5. The apparatus of claim 2 wherein said feedback controller instructs said radio-frequency generator to deliver a predetermined current frequency during each of said subsequent pick-and-place cycle.

6. The apparatus of claim 5 wherein said feedback controller instructs said radio-frequency generator to change or regulate during each of said subsequent pick-and-place cycle said predetermined current frequency.

7. A method for inductively soldering electronic components into a PCB, comprising the steps of:
(a) placing electronic components over a PCB with adequate amount of solder material interposed between their leads and pads to be soldered producing a solderable PCB assembly, and
(b) positioning said solderable PCB assembly on a matrix inductor in a predetermined relative position, said matrix inductor comprising a multiplicity of inductor cells, and
(c) selectively supplying alternating currents to any of said multiplicity of inductor cells of said matrix inductor in a predetermined electrical connection for a predetermined time duration, in order to cause localized electromagnetic induction heating of the joints to be soldered whereby causing the joints to become soldered while the body of the electronic components and the dielectric material of the PCB and its interconnecting traces all remain relatively cold.

8. The method of claim 7, wherein said predetermined time duration is controlled during step (c) of the soldering process so as to account for the individual thermal-mass of each joint been soldered.

9. The method of claim 8, wherein the frequency of said alternating currents is controlled during step (c) of the soldering process so as to attain a desired heat penetration or skin thickness effect by accounting for the actual physical size of each joint been soldered.

10. The method of claim 7, wherein the intensity of said alternating currents is controlled during step (c) of the soldering process so as to account for the individual thermal-mass of each joint been soldered.

11. The method of claim 10, wherein the frequency of said alternating currents is controlled during step (c) of the soldering process, so as to attain a desired heat penetration or skin thickness effect by accounting for the actual physical size of each joint been soldered.

12. An apparatus primarily intended for inductively soldering electronic components to dissimilar PCBs, comprising:

(a) a matrix inductor placed stationary against a PCB that includes a plurality of electronic components each component with several joints ready to be soldered, said matrix inductor comprising a multiplicity of inductor cells that are comparable in size to each of said several joints ready to be soldered, and
(b) a radio-frequency generator having a power output directly connected to a set of inductor cells conforming with a predetermined electrical connection specifically preselected for said PCB configuration, said set of inductor cells includes a few but not all of said multiplicity of inductor cells comprised into said matrix inductor, said predetermined electrical connection only permits to simultaneously generate localized heat for a predetermined time duration onto all of said several joints ready to be soldered by turning on-and-off said radio-frequency generator whereby in a single operation said plurality of electronic components are being simultaneously soldered while the body of each electronic component forming part of said plurality of electronic components and the dielectric material of said PCB and its interconnecting traces all remain relatively cold.

13. An apparatus primarily intended for inductively soldering electronic components to dissimilar PCBs, comprising:
(a) a matrix inductor placed stationary against a PCB that includes a plurality of electronic components each component with several joints ready to be soldered, said matrix inductor comprising a multiplicity of inductor cells that are comparable in size to each of said several joints ready to be soldered, and
(b) a radio-frequency generator having a power output, and
(c) a switching device that connects said power output of said radio-frequency generator to a set of inductor cells conforming with a predetermined electrical connection specifically preselected for said PCB configuration, said set of inductor cells includes a few but not all of said multiplicity of inductor cells comprised into said matrix inductor, said predetermined electrical connection only permits to simultaneously generate localized heat for a predetermined time duration onto all of said several joints ready to be soldered by turning on-and-off said radio-frequency generator whereby said switching device facilitates a priori manual selection of said predetermined electrical connection so that in a single operation said plurality of electronic components are being simultaneously soldered while the body of each electronic component forming part of said plurality of electronic components and the dielectric material of said PCB and its interconnecting traces all remain relatively cold.

14. An apparatus primarily intended for inductively soldering electronic components to dissimilar PCBs in automated fashion, comprising:
(a) a matrix inductor placed stationary against a PCB that includes a plurality of electronic components each component with several joints ready to be soldered, said matrix inductor comprising a multiplicity of inductor cells that are comparable in size to each of said several joints ready to be soldered, and
(b) a radio-frequency generator having a power output, and
(c) a switching device that connects said power output of said radio-frequency generator to a set of inductor cells conforming with a predetermined electrical connection cycle specifically preselected for said PCB configuration, said set of inductor cells includes a few but not all of said multiplicity of inductor cells comprised into said matrix inductor, and (d) a programmable controller that drives or instructs said switching device on how to connect said power output of said radio-frequency generator to said set of inductor cells in a predetermined electrical connection cycle, said predetermined electrical connection cycle permits to either simultaneously or sequentially connect each inductor cell forming part of said set of inductors cells for a predetermined individual time duration that accounts for the individual thermal-mass of each joint being soldered in order to only generate adequate localized heat onto all of said several joints ready to be soldered whereby said programmable controller automates the implementation of said predetermined electrical connection cycle so that in a single operation said plurality of electronic components are being either simultaneously or sequentially soldered while the body of each electronic component forming part of said plurality of electronic components and the dielectric material of said PCB and its interconnecting traces all remain relatively cold.

* * * * *